(12) United States Patent
     Yang

(10) Patent No.: US 10,284,355 B2
(45) Date of Patent: May 7, 2019

(54) COMMUNICATION DEVICE AND ELECTRONIC DEVICE INCLUDING THE SAME

(71) Applicant: Samsung Electronics Co., Ltd., Gyeonggi-do (KR)

(72) Inventor: Dongil Yang, Gyeonggi-do (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 118 days.

(21) Appl. No.: 15/190,373

(22) Filed: Jun. 23, 2016

(65) Prior Publication Data
     US 2016/0381687 A1     Dec. 29, 2016

(30) Foreign Application Priority Data
     Jun. 25, 2015  (KR) .......................... 10-2015-0090567

(51) Int. Cl.
     *H04L 5/14*   (2006.01)
     *H03H 7/40*   (2006.01)
     *H03H 9/72*   (2006.01)

(52) U.S. Cl.
     CPC ................ *H04L 5/14* (2013.01); *H03H 7/40* (2013.01); *H03H 9/725* (2013.01)

(58) Field of Classification Search
     CPC ............. H03H 7/40; H03H 9/725; H04L 5/14
     USPC ........................................................ 370/281
     See application file for complete search history.

(56) References Cited

U.S. PATENT DOCUMENTS

| | | |
|---|---|---|
| 3,931,575 A | 1/1976 | Amoroso, Jr. |
| 3,935,533 A | 1/1976 | Amoroso, Jr. |
| 4,212,013 A | 7/1980 | Biethan et al. |
| 4,398,283 A | 8/1983 | Pottier |
| 4,513,413 A | 4/1985 | Gorman et al. |
| 4,566,761 A | 1/1986 | Carlsen et al. |
| 4,628,501 A | 12/1986 | Loscoe |
| 4,646,296 A | 2/1987 | Bartholet et al. |
| 4,775,847 A | 10/1988 | Epsom et al. |
| 4,979,170 A | 12/1990 | Gilhousen et al. |
| 5,020,153 A | 5/1991 | Choa et al. |
| 5,227,748 A | 7/1993 | Sroka |
| 5,416,454 A | 5/1995 | McVeety |
| 5,438,329 A | 8/1995 | Gastouniotis et al. |
| 5,475,871 A | 12/1995 | Shalev et al. |
| 5,630,223 A | 5/1997 | Bahu et al. |
| 5,717,368 A | 2/1998 | Niiranen |
| 5,815,804 A * | 9/1998 | Newell ................. H04B 1/005 330/101 |
| 5,852,603 A | 12/1998 | Lehtinen et al. |
| 5,963,856 A | 10/1999 | Kim |
| 6,215,816 B1 | 4/2001 | Gillespie et al. |
| 6,492,883 B2 | 12/2002 | Liang et al. |

(Continued)

*Primary Examiner* — Stephen J Clawson
(74) *Attorney, Agent, or Firm* — Cha & Reiter, LLC

(57) ABSTRACT

A communication device includes: a communication module configured to discover a network capable of communication; a processor configured to identify a first frequency band of the network and to output a control signal for changing a pass band of a band pass filter; a multiplexer configured to change the pass band of the band pass filter to correspond to the first frequency band of the network; and a tunable tuner circuit configured to change an impedance thereof according to the control signal.

9 Claims, 14 Drawing Sheets

(56) References Cited

U.S. PATENT DOCUMENTS

| | | |
|---|---|---|
| 6,535,748 B1 | 3/2003 | Vuorio et al. |
| 6,653,912 B2 | 11/2003 | Robinson et al. |
| 6,658,237 B1 | 12/2003 | Rozenblit et al. |
| 6,731,946 B1 | 5/2004 | Stanwood et al. |
| 6,738,418 B1 | 5/2004 | Stiscia et al. |
| 6,816,714 B2 | 11/2004 | Toncich |
| 6,825,818 B2 | 11/2004 | Toncich |
| 6,880,463 B2 | 4/2005 | De Meulemeester et al. |
| 6,914,950 B1 | 7/2005 | Luneau |
| 6,918,704 B2 | 7/2005 | Marrs et al. |
| 6,954,774 B1 * | 10/2005 | Mulbrook ............ H03H 7/0161 708/819 |
| 6,978,092 B2 | 12/2005 | Conchas et al. |
| 7,054,600 B2 | 5/2006 | Bogner et al. |
| 7,062,235 B2 | 6/2006 | Henriksson |
| 7,107,033 B2 | 9/2006 | du Toit |
| 7,174,147 B2 | 2/2007 | Toncich et al. |
| 7,180,391 B2 | 2/2007 | Ala-Kojola |
| 7,184,727 B2 | 2/2007 | Poilasne et al. |
| 7,187,904 B2 | 3/2007 | Gainey et al. |
| 7,212,789 B2 | 5/2007 | Kuffner |
| 7,224,248 B2 | 5/2007 | D'Ostilio |
| 7,265,643 B2 | 9/2007 | Toncich |
| 7,340,280 B2 | 3/2008 | Niemela et al. |
| 7,373,115 B2 | 5/2008 | Monroe |
| 7,385,467 B2 | 6/2008 | Stoemmer et al. |
| 7,439,828 B2 | 10/2008 | Wada |
| 7,446,628 B2 | 11/2008 | Morris, III |
| 7,463,121 B2 | 12/2008 | D'Ostilio |
| 7,499,681 B2 | 3/2009 | Chang et al. |
| 7,509,100 B2 | 3/2009 | Toncich |
| 7,522,016 B2 | 4/2009 | Toncich et al. |
| 7,561,645 B2 | 7/2009 | Smith |
| 7,576,627 B2 | 8/2009 | Shastry et al. |
| 7,587,141 B2 | 9/2009 | Fisher |
| 7,593,696 B2 | 9/2009 | Fischer |
| 7,671,804 B2 | 3/2010 | Zhang et al. |
| 7,675,388 B2 | 3/2010 | Cardona et al. |
| 7,676,244 B2 | 3/2010 | Park et al. |
| RE41,247 E | 4/2010 | Braun et al. |
| 7,825,745 B1 | 11/2010 | Gavin et al. |
| 7,894,779 B2 | 2/2011 | Meiyappan et al. |
| RE42,225 E | 3/2011 | Stanwood et al. |
| 7,910,510 B2 | 3/2011 | Paul et al. |
| 7,937,056 B2 | 5/2011 | Itaya et al. |
| 7,945,217 B2 | 5/2011 | Rubin et al. |
| 7,966,438 B2 | 6/2011 | Punyko et al. |
| 7,983,627 B2 | 7/2011 | Adler et al. |
| 8,005,448 B1 | 8/2011 | Yan et al. |
| 8,023,999 B2 | 9/2011 | Fischer |
| 8,045,926 B2 | 10/2011 | Martikkala et al. |
| 8,095,067 B2 | 1/2012 | Gainey et al. |
| 8,130,058 B2 | 3/2012 | Cardona et al. |
| 8,145,141 B2 | 3/2012 | Toncich et al. |
| 8,158,595 B2 | 4/2012 | Galloway et al. |
| 8,204,031 B2 | 6/2012 | Jian et al. |
| 8,208,865 B2 | 6/2012 | Mikhemar et al. |
| 8,229,366 B2 | 7/2012 | Simon et al. |
| 8,270,927 B2 | 9/2012 | Wallace et al. |
| 8,324,984 B2 | 12/2012 | Gavin et al. |
| 8,369,250 B1 | 2/2013 | Khlat |
| 8,385,871 B2 | 2/2013 | Wyville |
| 8,390,380 B2 | 3/2013 | Kobayashi |
| 8,405,568 B2 | 3/2013 | Knudsen et al. |
| 8,428,105 B2 | 4/2013 | Wang et al. |
| 8,432,234 B2 | 4/2013 | Manssen et al. |
| 8,451,175 B2 | 5/2013 | Gummalla et al. |
| 8,489,056 B2 | 7/2013 | Wyville |
| 8,520,564 B1 | 8/2013 | Lorg et al. |
| 8,553,589 B2 | 10/2013 | Hui et al. |
| 8,571,489 B2 | 10/2013 | Mikhemar et al. |
| 8,583,197 B2 | 11/2013 | Rofougaran |
| 8,584,192 B2 | 11/2013 | Palinkas et al. |
| 8,599,726 B2 | 12/2013 | Mikhemar et al. |
| 8,603,996 B2 | 12/2013 | Galloway et al. |
| 8,680,947 B1 | 3/2014 | Costa et al. |
| 8,682,260 B1 | 3/2014 | Granger-Jones et al. |
| 8,704,598 B2 | 4/2014 | Kobayashi |
| 2001/0030988 A1 | 10/2001 | Fry |
| 2004/0090365 A1 | 5/2004 | Newberg et al. |
| 2004/0185795 A1 | 9/2004 | Shamsaifar et al. |
| 2004/0224649 A1 | 11/2004 | Shamsaifar |
| 2004/0261569 A1 | 12/2004 | Jacobs et al. |
| 2005/0075125 A1 | 4/2005 | Bada et al. |
| 2005/0128029 A1 | 6/2005 | Lee et al. |
| 2005/0164647 A1 | 7/2005 | Shamsaifar |
| 2005/0212623 A1 | 9/2005 | Ala-Kojola |
| 2006/0178114 A1 * | 8/2006 | Fischer ................ H03H 7/12 455/87 |
| 2006/0217082 A1 | 9/2006 | Fischer |
| 2007/0024393 A1 | 2/2007 | Forse et al. |
| 2007/0132065 A1 | 6/2007 | Lee et al. |
| 2008/0144642 A1 | 6/2008 | Song |
| 2009/0267851 A1 | 10/2009 | Morris, III |
| 2010/0048421 A1 | 2/2010 | Han et al. |
| 2010/0110943 A2 | 5/2010 | Gummalla et al. |
| 2010/0118924 A1 | 5/2010 | Pal |
| 2010/0182216 A1 | 7/2010 | Schmidhammer |
| 2010/0233678 A1 | 9/2010 | Beadling |
| 2010/0311404 A1 * | 12/2010 | Shi ................ H04W 8/205 455/419 |
| 2010/0329157 A1 | 12/2010 | Xing et al. |
| 2011/0064005 A1 | 3/2011 | Mikhemar et al. |
| 2011/0117862 A1 | 5/2011 | Bagger et al. |
| 2011/0299435 A1 | 12/2011 | Mikhemar et al. |
| 2011/0299436 A1 | 12/2011 | Mikhemar et al. |
| 2011/0299438 A1 | 12/2011 | Mikhemar et al. |
| 2012/0093044 A1 | 4/2012 | Ishida |
| 2012/0112853 A1 | 5/2012 | Hikino et al. |
| 2012/0140682 A1 | 6/2012 | Reed et al. |
| 2012/0163245 A1 | 6/2012 | Tone et al. |
| 2012/0201172 A1 | 8/2012 | Khlat et al. |
| 2012/0243447 A1 | 9/2012 | Weissman et al. |
| 2012/0256702 A1 | 10/2012 | Khlat et al. |
| 2013/0071108 A1 | 3/2013 | Park et al. |
| 2013/0083703 A1 | 4/2013 | Granger-Jones et al. |
| 2013/0115894 A1 | 5/2013 | Yin et al. |
| 2013/0136038 A1 | 5/2013 | Spagnolini et al. |
| 2013/0142089 A1 | 6/2013 | Azarnaminy et al. |
| 2013/0149982 A1 | 6/2013 | Wyville |
| 2013/0154635 A1 | 6/2013 | Mandal et al. |
| 2013/0165067 A1 | 6/2013 | DeVries et al. |
| 2013/0170405 A1 | 7/2013 | Yan et al. |
| 2013/0176912 A1 | 7/2013 | Khlat |
| 2013/0201880 A1 | 8/2013 | Bauder et al. |
| 2013/0201881 A1 | 8/2013 | Bauder et al. |
| 2013/0201882 A1 | 8/2013 | Bauder et al. |
| 2013/0208631 A1 | 8/2013 | Dufrene |
| 2013/0210375 A1 | 8/2013 | Dufrene |
| 2013/0234806 A1 | 9/2013 | Schmidhammer et al. |
| 2013/0242809 A1 | 9/2013 | Tone et al. |
| 2013/0244589 A1 | 9/2013 | Schmidhammer et al. |
| 2013/0244591 A1 | 9/2013 | Weissman et al. |
| 2013/0271243 A1 | 10/2013 | Haunberger et al. |
| 2013/0295688 A1 | 11/2013 | Bailey et al. |
| 2013/0321097 A1 | 12/2013 | Khlat et al. |
| 2013/0322309 A1 | 12/2013 | Smith |
| 2013/0343237 A1 | 12/2013 | Mikhemar et al. |
| 2013/0343244 A1 | 12/2013 | Hui et al. |
| 2013/0344819 A1 | 12/2013 | Ozgur et al. |
| 2014/0036736 A1 | 2/2014 | Wyville |
| 2014/0049337 A1 | 2/2014 | Schmidhammer |
| 2014/0055210 A1 | 2/2014 | Black et al. |
| 2014/0073264 A1 | 3/2014 | Rofougaran |

* cited by examiner

⟨1101⟩

⟨1103⟩

⟨1201⟩

⟨1203⟩

COMMUNICATION DEVICE AND ELECTRONIC DEVICE INCLUDING THE SAME

CLAIM OF PRIORITY

This application claims priority from and the benefit under 35 U.S.C. § 119(a) of Korean Patent Application No. 10-2015-0090567, filed on Jun. 25, 2015, which is hereby incorporated by reference for all purposes as if fully set forth herein.

BACKGROUND

1. Field

The present disclosure relates to communication devices, in particular embodiments disclosed in the present disclosure relate to a communication device that includes a radio frequency (RF) front-end module (FEM) using a tunable duplexer and an electronic device that includes the communication device.

2. Description of the Prior Art

In general, compact and high-performance components that constitute an RF module are required for multi-functionality and multi-band functionality in electronic devices that are capable of communication, such as a smart phone, a tablet PC, a portable multimedia player (PMP), a personal digital assistant (PDA), a laptop personal computer (PC), and a wearable device (e.g., a wrist watch, a head-mounted display (HMD), etc.).

SUMMARY

A duplexer is connected to an antenna and separates transmission frequency and reception frequency to perform a function of supporting two-way communication.

In the related art, in cases where the separation band between transmission and reception frequencies is small, or transmission and reception frequency bands are wide, a plurality of duplexers have to be used to cover frequencies in all bands so that it is difficult to make an electronic device compact.

A communication device and an electronic device that includes the same, according to various embodiments of the present disclosure, may provide a duplexer that can change a transmittable/receivable frequency band according to frequencies, thereby simultaneously implementing an improvement in the performance of separation between frequency bands and an improvement in insertion loss.

A communication device, according to various embodiments of the present disclosure, may include: a communication module configured to discover a network capable of communication; a processor configured to identify a first frequency band of the network and to output a control signal for changing a pass band of a band pass filter; a multiplexer configured to change the pass band of the band pass filter to correspond to the first frequency band of the network, and a tunable tuner circuit configured to change an impedance thereof according to the control signal.

A method for communicating in an electronic device, according to various embodiments of the present disclosure, may include: discovering a network capable of communication, identifying a frequency band of the network, generating a control signal for changing a pass band of a band pass filter, and changing the pass band of the band pass filter to correspond to the first frequency band of the network by changing an impedance of a tunable tuner circuit according to the control signal. The communication device and the electronic device that includes the same, according to the various embodiments of the present disclosure, include the duplexer that can change a transmittable/receivable frequency band according to frequencies, which makes it possible to minimize the number of used components and to reduce the size of the components.

BRIEF DESCRIPTION OF THE DRAWINGS

The above features, and advantages of the present disclosure will be more apparent from the following detailed description in conjunction with the accompanying drawings, in which.

DETAILED DESCRIPTION

Figure 1:
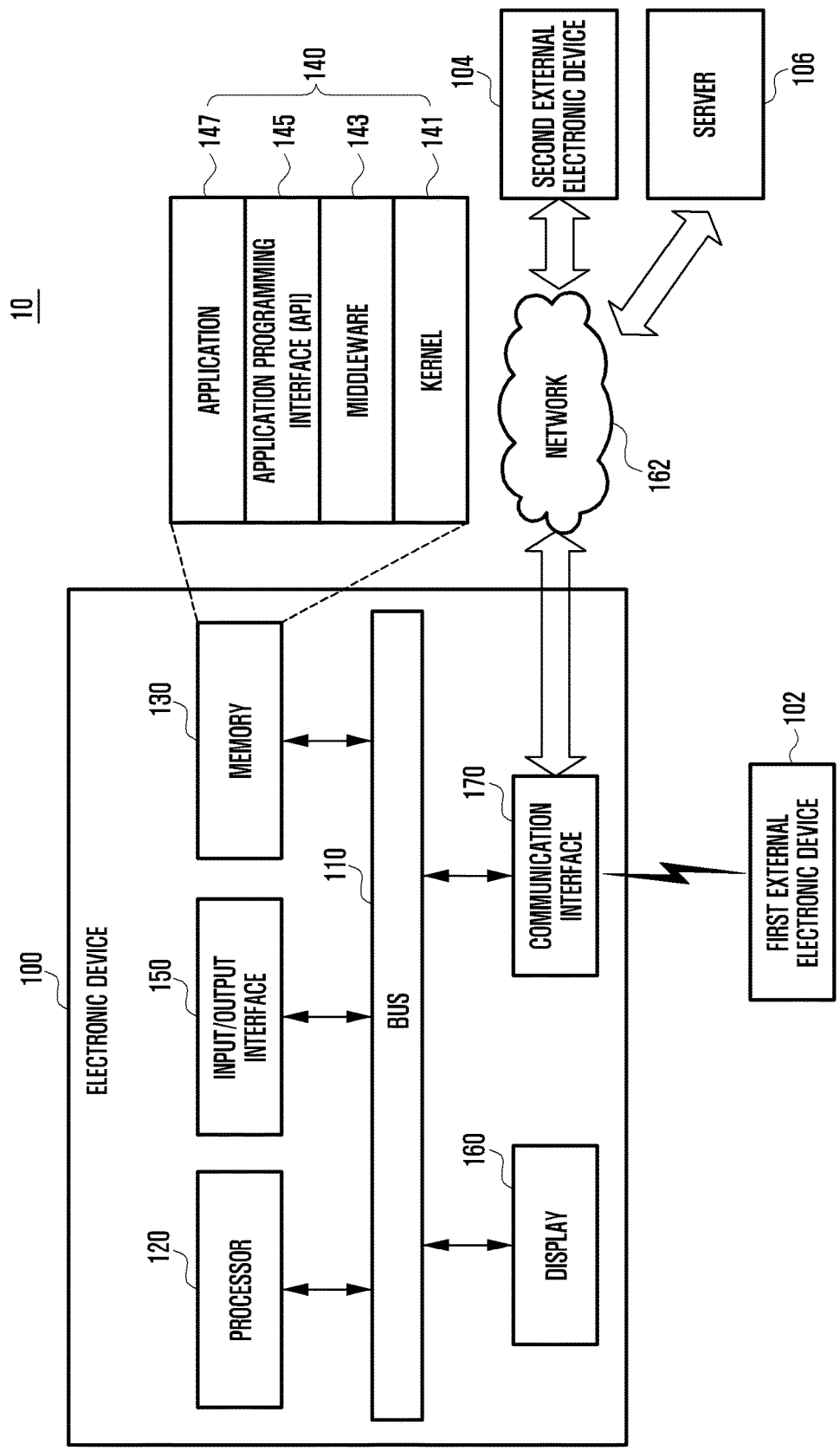
FIG. 1 is a diagram illustrating an electronic device within a network environment according to various embodiments of the present disclosure.

Hereinafter, the present disclosure will be described with reference to the accompanying drawings. Although specific embodiments are illustrated in the drawings and related detailed descriptions are discussed in the present specification, the present disclosure may have various modifications and several embodiments. However, various embodiments of the present disclosure are not limited to a specific implementation form and it should be understood that the present disclosure includes all changes and/or equivalents and substitutes included in the spirit and scope of various embodiments of the present disclosure. In connection with descriptions of the drawings, similar components are designated by the same reference numeral.

The term "include" or "may include" which may be used in describing various embodiments of the present disclosure refers to the existence of a corresponding disclosed function, operation or component which can be used in various embodiments of the present disclosure and does not limit one or more additional functions, operations, or components. In various embodiments of the present disclosure, the terms such as "include" or "have" may be construed to denote a certain characteristic, number, step, operation, constituent element, component or a combination thereof, but may not be construed to exclude the existence of or a possibility of addition of one or more other characteristics, numbers, steps, operations, constituent elements, components or combinations thereof.

In various embodiments of the present disclosure, the expression "or" or "at least one of A or/and B" includes any or all of combinations of words listed together. For example, the expression "A or B" or "at least A or/and B" may include A, may include B, or may include both A and B.

The expression "1", "2", "first", or "second" used in various embodiments of the present disclosure may modify various components of the various embodiments but does not limit the corresponding components. For example, the above expressions do not limit the sequence and/or importance of the components. The expressions may be used for distinguishing one component from other components. For example, a first user device and a second user device indicate different user devices although both of them are user devices. For example, without departing from the scope of the present disclosure, a first structural element may be referred to as a second structural element. Similarly, the second structural element also may be referred to as the first structural element.

When it is stated that a component is "coupled to" or "connected to" another component, the component may be directly coupled or connected to another component or a new component may exist between the component and another component. In contrast, when it is stated that a component is "directly coupled to" or "directly connected to" another component, a new component does not exist between the component and another component.

The terms used in describing various embodiments of the present disclosure are only examples for describing a specific embodiment but do not limit the various embodiments of the present disclosure. Singular forms are intended to include plural forms unless the context clearly indicates otherwise.

Unless defined differently, all terms used herein, which include technical terminologies or scientific terminologies, have the same meaning as that understood by a person skilled in the art to which the present disclosure belongs. Such terms as those defined in a generally used dictionary are to be interpreted to have the meanings equal to the contextual meanings in the relevant field of art, and are not to be interpreted to have ideal or excessively formal meanings unless clearly defined in the present description.

An electronic device according to various embodiments of the present disclosure may be a device including a communication function. For example, the electronic device may be one or a combination of a smart phone, a tablet Personal Computer (PC), a mobile phone, a video phone, an e-book reader, a desktop PC, a laptop PC, a netbook computer, a Personal Digital Assistant (PDA), a camera, a wearable device (for example, a Head-Mounted-Device (HMD) such as electronic glasses, electronic clothes, and electronic bracelet, an electronic necklace, an electronic appcessary, an electronic tattoo, and a smart watch.

According to some embodiments, the electronic device may be a smart home appliance having a communication function. The smart home appliance may include at least one of a Television (TV), a Digital Video Disk (DVD) player, an audio player, an air conditioner, a cleaner, an oven, a microwave oven, a washing machine, an air cleaner, a set-top box, a TV box (for example, Samsung HomeSync™, Apple TV™, or Google TV™), game consoles, an electronic dictionary, an electronic key, a camcorder, and an electronic frame.

According to some embodiments, the electronic device may include at least one of various types of medical devices (for example, Magnetic Resonance Angiography (MRA), Magnetic Resonance Imaging (MRI), Computed Tomography (CT), a scanner, an ultrasonic device and the like), a navigation device, a Global Positioning System (GPS) receiver, an Event Data Recorder (EDR), a Flight Data Recorder (FDR), a vehicle infotainment device, electronic equipment for a ship (for example, a navigation device for ship, a gyro compass and the like), avionics, a security device, a head unit for a vehicle, an industrial or home robot, an Automatic Teller Machine (ATM) of financial institutions, and a Point Of Sale (POS) device of shops.

According to some embodiments, the electronic device may include at least one of furniture or a part of a building/structure, an electronic board, an electronic signature receiving device, a projector, and various types of measuring devices (for example, a water meter, an electricity meter, a gas meter, a radio wave meter and the like) including a camera function. The electronic device according to various embodiments of the present disclosure may be one or a combination of the above described various devices. Further, the electronic device according to various embodiments of the present disclosure may be a flexible device. It is apparent to those skilled in the art that the electronic device according to various embodiments of the present disclosure is not limited to the above described devices.

Hereinafter, an electronic device according to various embodiments of the present disclosure will be described with reference to the accompanying drawings. The term "user" used in various embodiments may refer to a person who uses an electronic device or a device (for example, an artificial intelligence electronic device) which uses an electronic device.

According to one embodiment of the present disclosure, a screen of an electronic device may be split into at least two windows according to a predefined split manner and displayed through a display of an electronic device. The windows are defined as split windows. According to one embodiment, the split windows are defined as windows displayed on a display of an electronic display not to be superposed one on another.

According to one embodiment, a popup window is defined as a window displayed on a display of an electronic device to hide or to be superposed on a portion of a screen under execution.

According to one embodiment of the present disclosure, an electronic device using split window and a popup window is capable of displaying two or more application execution screens or function execution screens. Thus, the split windows and the popup window are defined as a multi-window.

Hereinafter, an electronic device according to various embodiments will be described with reference to the accompanying drawings.

FIG. 1 illustrates a network environment 10 including an electronic device 100 according to various embodiments of the present disclosure. Referring to FIG. 1, the electronic device 100 includes a bus 110, a processor 120, a memory 130, an input/output module 150, a display module 160 and a communication module 170. The terms "unit" or "module" referred to herein is to be understood as comprising hardware such as a processor or microprocessor configured for a certain desired functionality, or a non-transitory medium comprising machine executable code, in accordance with statutory subject matter under 35 U.S.C. § 101 and does not constitute software per se.

The bus 110 may be a circuit connecting the above described components and transmitting communication (for example, a control message) between the above described components. The processor 120 receives commands from other components (for example, the memory 130, the input/output module 150, the display module 160, the communication module 170) through the bus 110, analyzes the received commands, and executes calculation or data processing according to the analyzed commands. The memory 130 stores commands or data received from the processor 120 or other components (for example, the input/output module 150, the display module 160, or the communication module 170) or generated by the processor 120 or other components. The memory 130 may include programming modules 140, for example, a kernel 141, middleware 143, an Application Programming Interface (API) 145, and an application 147. Each of the aforementioned programming modules may be implemented by software, firmware, hardware, or a combination of two or more thereof.

The kernel 141 controls or manages system resources (for example, the bus 110, the processor 120, or the memory 130) used for executing an operation or function implemented by the remaining other programming modules, for example, the middleware 143, the API 145, or the application 147. Further, the kernel 141 provides an interface for accessing individual components of the electronic device 101 from the middleware 143, the API 145, or the application 147 to control or manage the components. The middleware 143 performs a relay function of allowing the API 145 or the application 147 to communicate with the kernel 141 to exchange data. Further, in operation requests received from the application 147, the middleware 143 performs a control for the operation requests (for example, scheduling or load balancing) by using a method of assigning a priority, by which system resources (for example, the bus 110, the processor 120, the memory 130 and the like) of the electronic device 100 can be used, to the application 134.

The API 145 is an interface by which the application 147 can access a function provided by the kernel 141 or the middleware 143 and includes, for example, at least one interface or function (for example, command) for a file control, a window control, image processing, or a character control. The input/output module 150 can receive, for example, a command and/or data from a user, and transfer the received command and/or data to the processor 120 and/or the memory 130 through the bus 110. The display module 160 can display an image, a video, and/or data to a user.

According to an embodiment, the display module 160 may display a graphic user interface image for interaction between the user and the electronic device 100. According to various embodiments, the graphic user interface image may include interface information to activate a function for correcting color of the image to be projected onto the screen. The interface information may be in the form of, for example, a button, a menu, or an icon. The communication module 170 connects communication between the electronic device 100 and the external device (for example, electronic device 102, 104 or server 106). For example, the communication interface 170 may access a network 162 through wireless or wired communication to communicate with the external device. The wireless communication includes at least one of, for example, WiFi, Bluetooth (BT), Near Field Communication (NFC), a Global Positioning System (GPS), and cellular communication (for example, LTE, LTE-A, CDMA, WCDMA, UMTS, WiBro or GSM). The wired communication may include at least one of, for example, a Universal Serial Bus (USB), a High Definition Multimedia Interface (HDMI), Recommended Standard 232 (RS-232), and a Plain Old Telephone Service (POTS).

According to an embodiment, the server 106 supports driving of the electronic device 100 by performing at least one operation (or function) implemented by the electronic device 100. For example, the server 106 may include a communication control server module that supports the communication module 170 implemented in the electronic device 100. For example, the communication control server module may include at least one of the components of the communication module 170 to perform (on behalf of) at least one operations performed by the communication module 170.

Figure 2:
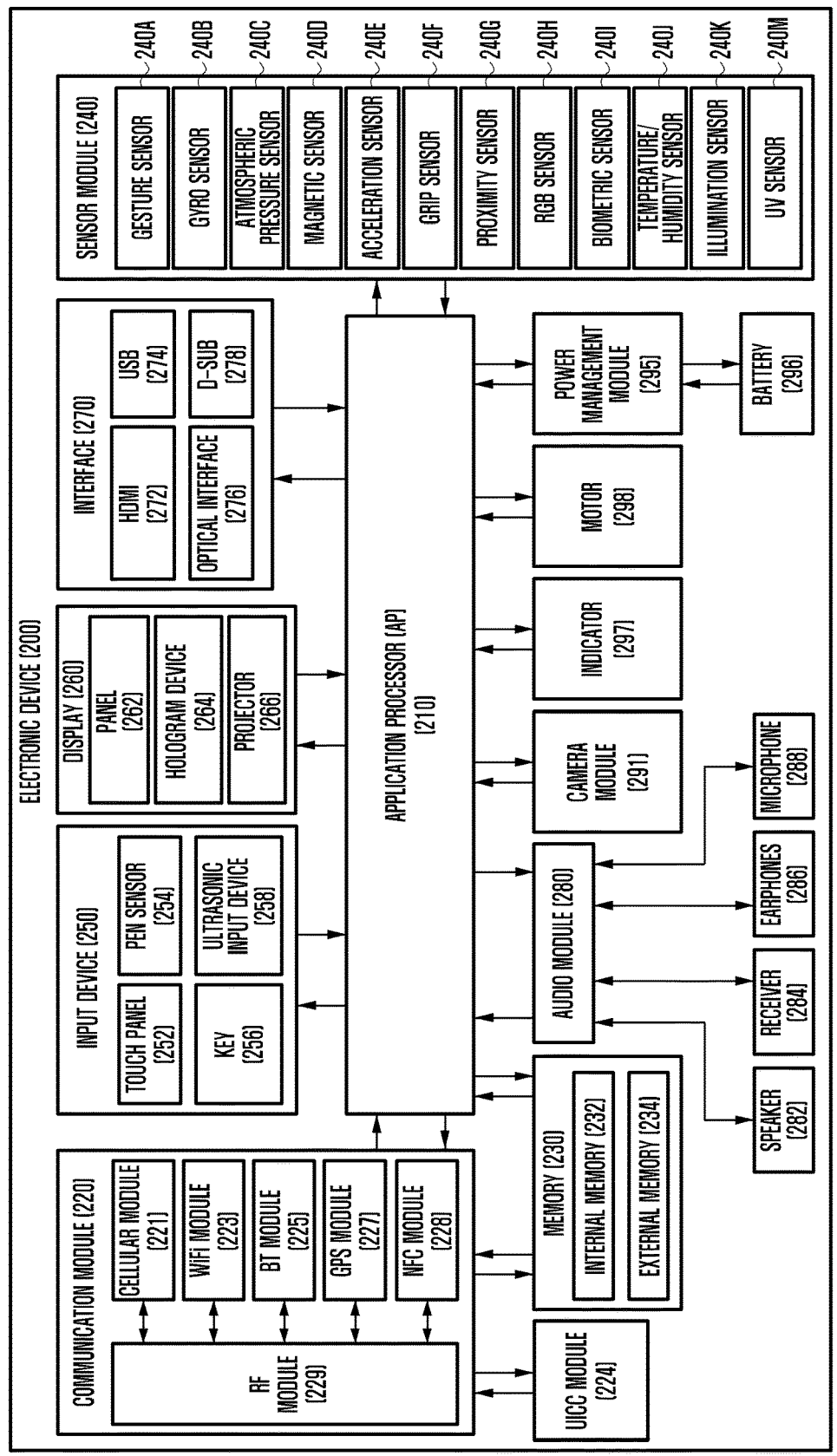
FIG. 2 is a block diagram of an electronic device according to various embodiments of the present disclosure.

FIG. 2 is a block diagram of an electronic device 200 according to various embodiments of the present disclosure. The electronic device 200 may configure, for example, a whole or a part of the electronic device 100 illustrated in FIG. 1. Referring to FIG. 2, the electronic device 200 includes one or more Application Processors (APs) 210, a communication module 220, a Subscriber Identification Module (SIM) card 224, a memory 230, a sensor module 240, an input device 250, a display 260, an interface 270, an audio module 280, a camera module 291, a power managing module 295, a battery 296, an indicator 297, and a motor 298.

The AP 210, which may be a processor, operates an operating system (OS) or an application program so as to control a plurality of hardware or software component elements connected to the AP 210 and execute various data processing and calculations including multimedia data. The AP 210 may be implemented by, for example, a System on Chip (SoC). According to an embodiment, the processor 210 may further include a Graphic Processing Unit (GPU). In addition, an artisan understands and appreciates that a "processor" or "microprocessor" constitute hardware in the claimed invention, which may be any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc.

The communication module 220 (for example, communication module 170) transmits/receives data in communication between different electronic devices (for example, the electronic device 104 and the server 106) connected to the electronic device 200 (for example, electronic device 100) through a network. According to an embodiment, the communication module 220 includes a cellular module 221, a WiFi module 223, a Bluetooth (BT) module 225, a Global Positioning System (GPS) module 227, a Near Field Communication (NFC) module 228, and a Radio Frequency (RF) module 229.

The cellular module 221 provides a voice, a call, a video call, a Short Message Service (SMS), or an Internet service through a communication network (for example, Long Term Evolution (LTE), LTE-A, Code Division Multiple Access (CDMA), Wideband CDMA (WCDMA), UMTS, WiBro, GSM or the like). Further, the cellular module 221 may distinguish and authenticate electronic devices within a communication network by using a subscriber identification module (for example, the SIM card 224). According to an embodiment, the cellular module 221 performs at least some of the functions which can be provided by the AP 210. For example, the cellular module 221 may perform at least some of the multimedia control functions.

According to an embodiment, the cellular module 221 may include a Communication Processor (CP). Further, the cellular module 221 may be implemented by, for example, an SoC.

According to an embodiment, the AP 210 or the cellular module 221 (for example, communication processor) may load a command or data received from at least one of a non-volatile memory and other components connected to each of the AP 210 and the cellular module 221 to a volatile memory and process the loaded command or data. Further, the AP 210 or the cellular module 221 may store data received from at least one of other components or generated by at least one of other components in a non-volatile memory.

Each of the WiFi module 223, the BT module 225, the GPS module 227, and the NFC module 228 may include, for example, a processor for processing data transmitted/received through the corresponding module. Although the cellular module 221, the WiFi module 223, the BT module 225, the GPS module 227, and the NFC module 228 are illustrated as blocks separate from each other in FIG. 8, at least some (for example, two or more) of the cellular module 221, the WiFi module 223, the BT module 225, the GPS module 227, and the NFC module 228 may be included in one Integrated Chip (IC) or one IC package according to one embodiment. For example, at least some (for example, the communication processor corresponding to the cellular module 221 and the WiFi processor corresponding to the WiFi module 223) of the processors corresponding to the cellular module 221, the WiFi module 223, the BT module 225, the GPS module 227, and the NFC module 228 may be implemented by one SoC.

The RF module 229 transmits/receives data, for example, an RF signal. Although not illustrated, the RF module 229 may include, for example, a transceiver, a Power Amp Module (PAM), a frequency filter, a Low Noise Amplifier (LNA) or the like. Further, the RF module 229 may further include a component for transmitting/receiving electronic waves over a free air space in wireless communication, for example, a conductor, a conducting wire, or the like. Although the cellular module 221, the WiFi module 223, the BT module 225, the GPS module 227, and the NFC module 228 share one RF module 229 in FIG. 2, at least one of the cellular module 221, the WiFi module 223, the BT module 225, the GPS module 227, and the NFC module 228 may transmit/receive an RF signal through a separate RF module according to one embodiment.

The SIM card 224 is a card including a Subscriber Identification Module and may be inserted into a slot formed in a particular portion of the electronic device. The SIM card 224 includes unique identification information (for example, Integrated Circuit Card Identifier (ICCID)) or subscriber information (for example, International Mobile Subscriber Identity (IMSI).

The memory 230 (for example, memory 130) may include an internal memory 232 or an external memory 234. The internal memory 232 may include, for example, at least one of a volatile memory (for example, a Random Access Memory (RAM), a dynamic RAM (DRAM), a static RAM (SRAM), a synchronous dynamic RAM (SDRAM), and the like), and a non-volatile Memory (for example, a Read Only Memory (ROM), a one-time programmable ROM (OTPROM), a programmable ROM (PROM), an erasable and programmable ROM (EPROM), an electrically erasable and programmable ROM (EEPROM), a mask ROM, a flash ROM, a NAND flash memory, an NOR flash memory, and the like).

According to an embodiment, the internal memory 232 may be a Solid State Drive (SSD). The external memory 234 may further include a flash drive, for example, a Compact Flash (CF), a Secure Digital (SD), a Micro Secure Digital (Micro-SD), a Mini Secure Digital (Mini-SD), an extreme Digital (xD), or a memory stick. The external memory 234 may be functionally connected to the electronic device 200 through various interfaces. According to an embodiment, the electronic device 200 may further include a storage device (or storage medium) such as a hard drive.

The sensor module 240 measures a physical quantity or detects an operation state of the electronic device 201, and converts the measured or detected information to an electronic signal. The sensor module 240 may include, for example, at least one of a gesture sensor 240A, a gyro sensor 240B, an atmospheric pressure (barometric) sensor 240C, a magnetic sensor 240D, an acceleration sensor 240E, a grip sensor 240F, a proximity sensor 240G, a color sensor 240H (for example, Red, Green, and Blue (RGB) sensor), a biometric sensor 240I, a temperature/humidity sensor 240J, an illumination (light) sensor 240K, and a Ultra Violet (UV) sensor 240M. Additionally or alternatively, the sensor module 240 may include, for example, a E-nose sensor, an electromyography (EMG) sensor, an electroencephalogram (EEG) sensor, an electrocardiogram (ECG) sensor, an Infrared (IR) sensor, an iris sensor, a fingerprint sensor (not illustrated), and the like. The sensor module 240 may further include a control circuit for controlling one or more sensors included in the sensor module 240.

The input device 250 includes a touch panel 252, a (digital) pen sensor 254, a key 256, and an ultrasonic input device 258. For example, the touch panel 252 may recognize a touch input in at least one type of a capacitive type, a resistive type, an infrared type, and an acoustic wave type. The touch panel 252 may further include a control circuit. In the capacitive type, the touch panel 252 can recognize proximity as well as a direct touch. The touch panel 252 may further include a tactile layer. In this event, the touch panel 252 provides a tactile reaction to the user.

The (digital) pen sensor 254 may be implemented, for example, using a method identical or similar to a method of receiving a touch input of the user, or using a separate recognition sheet. The key 256 may include, for example, a physical button, an optical key, or a key pad. The ultrasonic input device 258 is a device which can detect an acoustic wave by a microphone (for example, microphone 288) of the electronic device 200 through an input means generating an ultrasonic signal to identify data and can perform wireless recognition. According to an embodiment, the electronic device 200 receives a user input from an external device (for example, computer or server) connected to the electronic device 200 by using the communication module 220.

The display 260 (for example, display module 160) includes a panel 262, a hologram device 264, and a projector 266. The panel 262 may be, for example, a Liquid Crystal Display (LCD) or an Active Matrix Organic Light Emitting Diode (AM-OLED). The panel 262 may be implemented to be, for example, flexible, transparent, or wearable. The panel 262 may be configured by the touch panel 252 and one module. The hologram device 264 shows a stereoscopic image in the air by using interference of light. The projector 266 projects light on a screen to display an image. For example, the screen may be located inside or outside the electronic device 200. According to an embodiment, the display 260 may further include a control circuit for controlling the panel 262, the hologram device 264, and the projector 266.

The interface 270 includes, for example, a High-Definition Multimedia Interface (HDMI) 272, a Universal Serial Bus (USB) 274, an optical interface 276, and a D-subminiature (D-sub) 278. The interface 270 may be included in, for example, the communication module 170 illustrated in FIG. 1. Additionally or alternatively, the interface 290 may include, for example, a Mobile High-definition Link (MHL) interface, a Secure Digital (SD) card/Multi-Media Card (MMC), or an Infrared Data Association (IrDA) standard interface.

The audio module 280 bi-directionally converts a sound and an electronic signal. At least some components of the audio module 280 may be included in, for example, the input/output module 150 illustrated in FIG. 1. The audio module 280 processes sound information input or output through, for example, a speaker 282, a receiver 284, an earphone 286, the microphone 288 or the like.

The camera module 291 is a device which can photograph a still image and a video. According to an embodiment, the camera module 291 may include one or more image sensors (for example, a front sensor or a back sensor), an Image Signal Processor (ISP) (not shown) or a flash (for example, an LED or xenon lamp).

The power managing module 295 manages power of the electronic device 200. Although not illustrated, the power managing module 295 may include, for example, a Power Management Integrated Circuit (PMIC), a charger Integrated Circuit (IC), or a battery or fuel gauge.

The PMIC may be mounted to, for example, an integrated circuit or an SoC semiconductor. A charging method may be divided into wired and wireless methods. The charger IC charges a battery and prevent over voltage or over current from flowing from a charger. According to an embodiment, the charger IC includes a charger IC for at least one of the wired charging method and the wireless charging method. The wireless charging method may include, for example, a magnetic resonance method, a magnetic induction method and an electromagnetic wave method, and additional circuits for wireless charging, for example, circuits such as a coil loop, a resonant circuit, a rectifier or the like may be added.

The battery fuel gauge measures, for example, a remaining quantity of the battery 296, or a voltage, a current, or a temperature during charging. The battery 296 may store or generate electricity and supply power to the electronic device 200 by using the stored or generated electricity. The battery 296 may include a rechargeable battery or a solar battery. The indicator 297 shows particular statuses of the electronic device 200 or a part (for example, AP 210) of the electronic device 200, for example, a booting status, a message status, a charging status and the like. The motor 298 converts an electrical signal to a mechanical vibration.

Although not illustrated, the electronic device 200 may include a processing unit (for example, GPU) for supporting a module TV. The processing unit for supporting the mobile TV may process, for example, media data according to a standard of Digital Multimedia Broadcasting (DMB), Digital Video Broadcasting (DVB), media flow or the like.

Each of the components of the electronic device according to various embodiments of the present disclosure may be implemented by one or more components and the name of the corresponding component may vary depending on a type of the electronic device. The electronic device according to various embodiments of the present disclosure may include at least one of the above described components, a few of the components may be omitted, or additional components may be further included. Also, some of the components of the electronic device according to various embodiments of the present disclosure may be combined to form a single entity, and thus may equivalently execute functions of the corresponding components before being combined.

Figure 3:
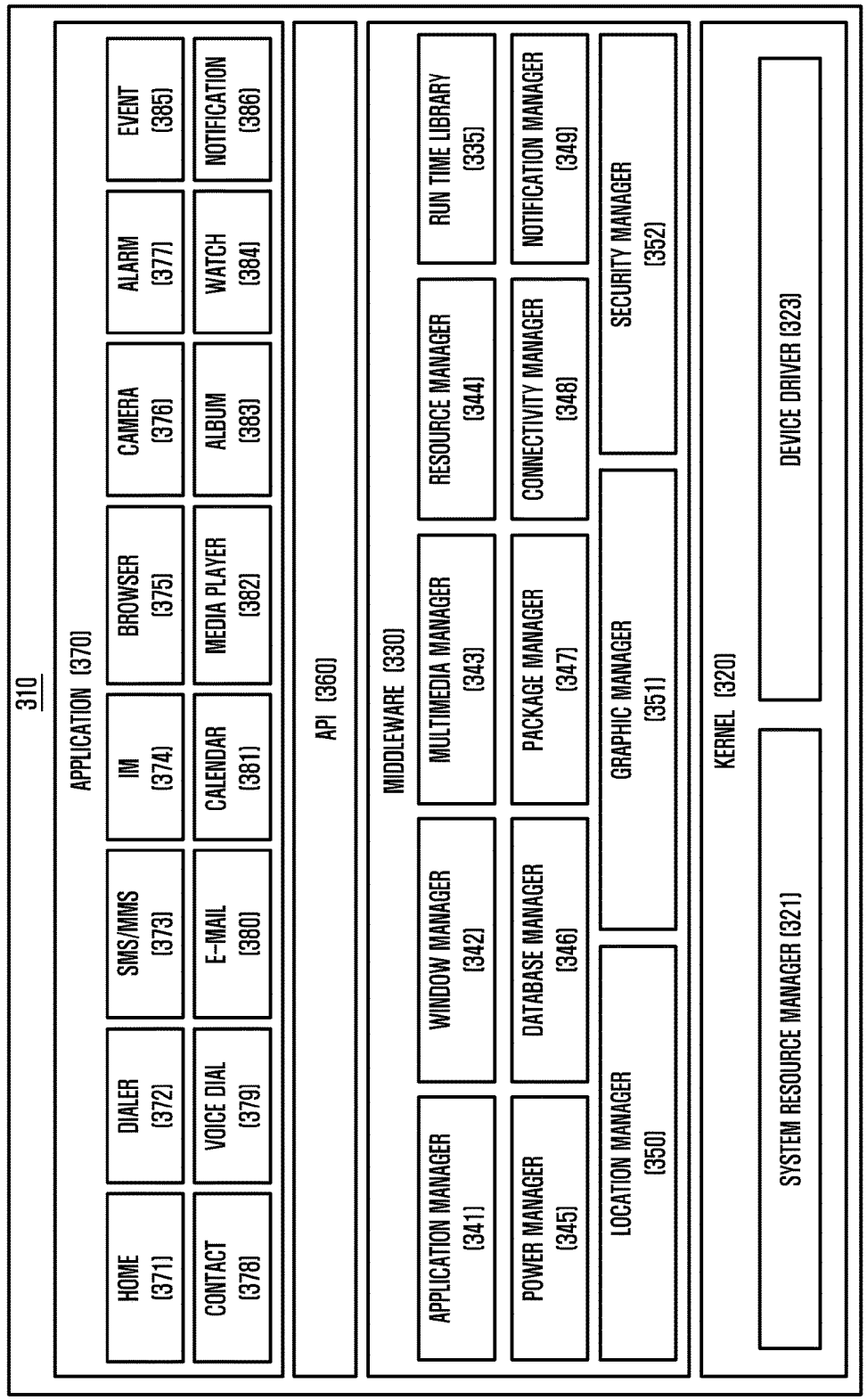
FIG. 3 is a block diagram of a program module according to various embodiments of the present disclosure.

FIG. 3 is a block diagram of a programming module 310 according to an embodiment. The programming module 310 (for example, programming module 140) may be included (stored) in the electronic device 100 (for example, memory 130) illustrated in FIG. 1. At least some of the programming module 310 may be formed of software, firmware, hardware, or a combination of at least two of software, firmware, and hardware. The programming module 310 may be executed in the hardware (for example, electronic device 100) to include an Operating System (OS) controlling resources related to the electronic device (for example, electronic device 100) or various applications (for example, applications 370) running on the OS. For example, the OS may be Android, iOS, Windows, Symbian, Tizen, Bada or the like. Referring to FIG. 3, the programming module 310 includes a kernel 320, a middleware 330, an Application Programming Interface (API) 360, and applications 370.

The kernel 320 (for example, kernel 141) includes a system resource manager 321 and a device driver 323. The system resource manager 321 may include, for example, a process manager, a memory manager, and a file system manager. The system resource manager 321 performs a system resource control, allocation, and recall. The device driver 323 may include, for example, a display driver, a camera driver, a Bluetooth driver, a shared memory driver, a USB driver, a keypad driver, a WiFi driver, and an audio driver. Further, according to an embodiment, the device driver 323 may include an Inter-Process Communication (IPC) driver. The middleware 330 includes a plurality of modules prepared in advance to provide a function required in common by the applications 370. Further, the middleware 330 provides a function through the API 360 to allow the application 370 to efficiently use limited system resources within the electronic device. For example, as illustrated in FIG. 3, the middleware 330 (for example, middleware 143) includes at least one of a runtime library 335, an application manager 341, a window manager 342, a multimedia manager 343, a resource manager 344, a power manager 345, a database manager 346, a package manager 347, a connection manager 348, a notification manager 349, a location manager 350, a graphic manager 351, and a security manager 352. The runtime library 335 includes, for example, a library module used by a complier to add a new function through a programming language while the application 370 is executed. According to an embodiment, the runtime library 335 executes input and output, management of a memory, a function associated with an arithmetic function and the like. The application manager 341 manages, for example, a life cycle of at least one of the applications 370. The window manager 342 manages GUI resources used on the screen. The multimedia manager 343 detects a format required for reproducing various media files and performs an encoding or a decoding of a media file by using a codec suitable for the corresponding format. The resource manager 344 manages resources such as a source code, a memory, or a storage space of at least one of the applications 370.

The power manager 345 operates together with a Basic Input/Output System (BIOS) to manage a battery or power and provides power information required for the operation. The database manager 346 manages generation, search, and change of a database to be used by at least one of the applications 370. The package manager 347 manages an installation or an update of an application distributed in a form of a package file.

The connection manager 348 manages, for example, a wireless connection such as WiFi or Bluetooth. The notification manager 349 displays or notifies a user of an event such as an arrival message, an appointment, a proximity alarm or the like, in a manner that does not disturb the user. The location manager 350 manages location information of the electronic device. The graphic manager 351 manages a graphic effect provided to the user or a user interface related to the graphic effect. The security manager 352 provides a general security function required for a system security or a user authentication. According to an embodiment, when the electronic device (for example, electronic device 100 or 200) has a call function, the middleware 330 may further include a telephony manager for managing a voice of the electronic device or a video call function. The middleware 330 may generate a new middleware module through a combination of various functions of the aforementioned internal component modules and use the generated new middleware module. The middleware 330 may provide a module specified for each type of operating system to provide a differentiated function. Further, the middleware 330 may dynamically delete some of the conventional components or add new components. Accordingly, some of the components described in the embodiment of the present disclosure may be omitted, replaced with other components having different names but performing similar functions, or other components may be further included.

The API 360 (for example, API 145) is a set of API programming functions, and may be provided with a different configuration according to an operating system. For example, in Android or iOS, a single API set may be provided for each platform. In Tizen, two or more API sets may be provided. The applications 370, which may include an application similar to the application 134, may include, for example, a preloaded application and/or a third party application. The applications 370 may include a home application 371 a dialer application 372, a Short Messaging Service (SMS)/Multimedia Messaging Service (MMS) application 373, an Instant Messaging (IM) application 374, a browser application 375, a camera application 376, an alarm application 377, a contact application 378, a voice dial application 379, an email application 380, a calendar application 381, a media player application 382, an album application 383, and a clock application 384. However, the present embodiment is not limited thereto, and the applications 370 may include any other similar and/or suitable application. At least a part of the programming module 310 can be implemented by commands stored in computer-readable storage media. When the commands are executed by at least one processor, e.g. the AP 210, at least one processor can perform functions corresponding to the commands. The computer-readable storage media may be, for example, the memory 230. At least a part of the programming module 310 can be implemented, e.g. executed, by, for example, the AP 210. At least a part of the programming module 310 may include, for example, a module, a program, a routine, a set of instructions and/or a process for performing at least one function.

The titles of the aforementioned elements of the programming module, e.g. the programming module 300, according to the present disclosure may vary depending on the type of the OS. The programming module according to the present disclosure may include at least one of the aforementioned elements and/or may further include other additional elements, and/or some of the aforementioned elements may be omitted. The operations performed by a programming module and/or other elements according to the present disclosure may be processed through a sequential, parallel, repetitive, and/or heuristic method, and some of the operations may be omitted and/or other operations may be added.

Figure 4:
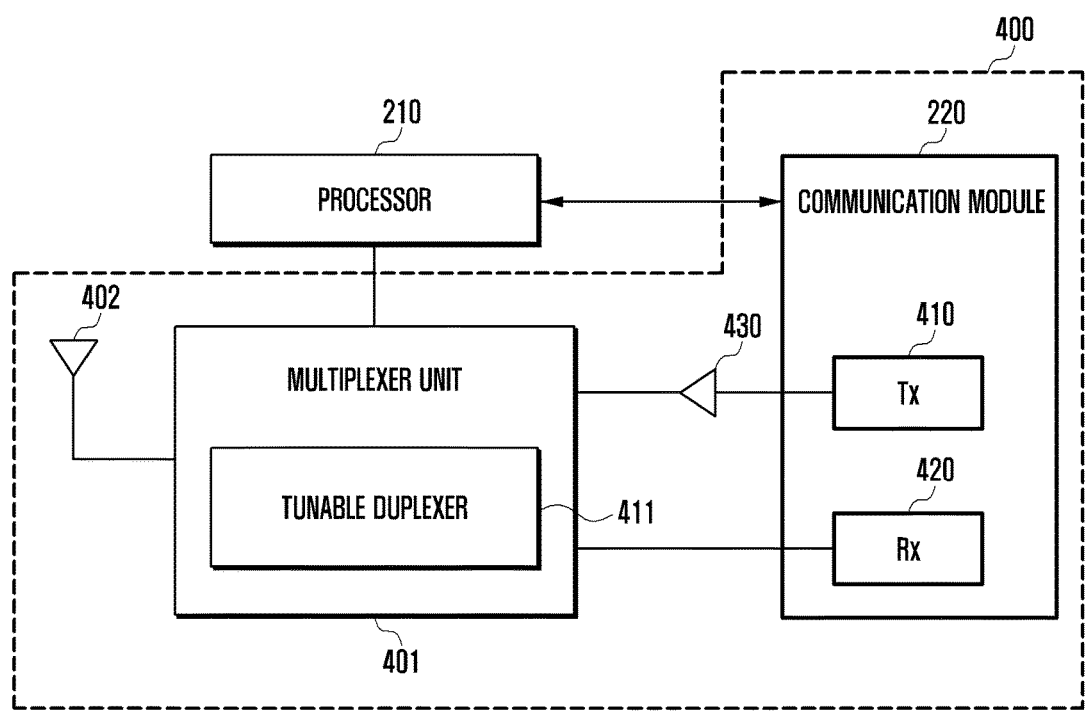
FIG. 4 is a block diagram of an electronic device that includes a communication device according to an embodiment of the present disclosure.

FIG. 4 is a block diagram of an electronic device 200 that includes a communication device 400 according to one embodiment of the present disclosure.

The electronic device 200 may include a processor 210 and the communication device 400. The electronic device 200 may control the communication device 400 using the processor 210. The processor 210 may be an application processor (AP) or a communication processor (CP).

The communication device 400 may include a multiplexer unit 401, an antenna unit 402, a communication module 220, and a buffer 430, and the communication module 220 may include a transmitting end (TX) 410 and a receiving end (RX) 420. The multiplexer unit 401 may include a tunable duplexer 411. The buffer 430 may forward, to the multiplexer unit 401, a signal that is transferred from the transmitting end 410.

The communication module 220 may control a signal transmitted by the transmitting end (TX) 410 and a signal received by the receiving end (RX) 420 under the control of the processor 210. The processor 210 may identify and control signals that are received and transmitted by the communication module 220.

In various embodiments, when a frequency capable of carrying communication or a transmittable/receivable frequency (e.g., the center frequency of a network or a network frequency band) is discovered through the communication module 220, the processor 210 may output a signal for controlling the tunable duplexer 411 such that the tunable duplexer 411 may have a resonant frequency that corresponds to the frequency capable of carrying communication or the transmittable/receivable frequency. According to the control signal of the processor 210, the tunable duplexer 411 may change a frequency pass band in order to filter the frequency band that corresponds to the frequency capable of carrying communication or the transmittable/receivable frequency.

In various embodiments, when a frequency capable of carrying communication or a transmittable/receivable frequency is discovered through the communication module 220, the processor 210 may output a control signal for selecting one of a plurality of SAW filters or band pass filters, which are included in the tunable duplexer 411, such that the tunable duplexer 411 may have a resonant frequency that corresponds to the frequency capable of carrying communication or the transmittable/receivable frequency. According to the control signal of the processor 210, the tunable duplexer 411 may select one of the plurality of SAW filters or band pass filters, which corresponds to a frequency pass band, in order to filter the frequency band that corresponds to the frequency capable of carrying communication or the transmittable/receivable frequency.

In various embodiments, when a frequency capable of carrying communication or a transmittable/receivable frequency is discovered through the communication module 220, the processor 210 may output a control signal for changing the impedance of a SAW filter or band pass filter, which is included in the tunable duplexer 411, such that the tunable duplexer 411 may have a resonant frequency that corresponds to the frequency capable of carrying communication or the transmittable/receivable frequency. According to the control signal of the processor 210, the tunable duplexer 411 may change the pass band of the SAW filter or band pass filter such that the SAW filter or band pass filter has an impedance that corresponds to a frequency pass band in order to filter the frequency band that corresponds to the frequency capable of carrying communication or the transmittable/receivable frequency.

The multiplexer unit 401 may forward a signal received through the antenna unit 402 to the electronic device 200, which is connected to the communication device 400, through the receiving end 420, and may forward a signal, which is transferred through the transmitting end 410 and the buffer 430 from the electronic device 200, through the antenna unit 402.

The tunable duplexer 411, which is included in the multiplexer unit 401, may change the resonant frequency thereof according to a control signal transferred from the processor 210. The communication device 400 may transmit/receive various bands of frequencies by changing the resonant frequency of the tunable duplexer 411 according to the control signal transferred from the processor 210.

The resonant frequency may be the same as the center frequency of a transmittable/receivable frequency band. In various embodiments, the resonant frequency may be a frequency for allowing the antenna unit 402 to operate with a net resistance.

The multiplexer unit 401 may include a band pass filter (BPF) that is capable of filtering signals that are transmitted and received through the antenna unit 402. In various embodiments of the present disclosure, the BPF may be a surface acoustic wave (SAW) filter. The BPF may perform band rejection for selectively separating frequencies in the band in which the communication device 400 can perform communication or transmission/reception.

The antenna unit 402 may include one or more antennas. The antenna unit 402, when transmitting electric waves, changes high-frequency power energy into radio frequency energy to radiate the same in the air, and changes the radio frequency energy into high-frequency power energy.

Figure 5:
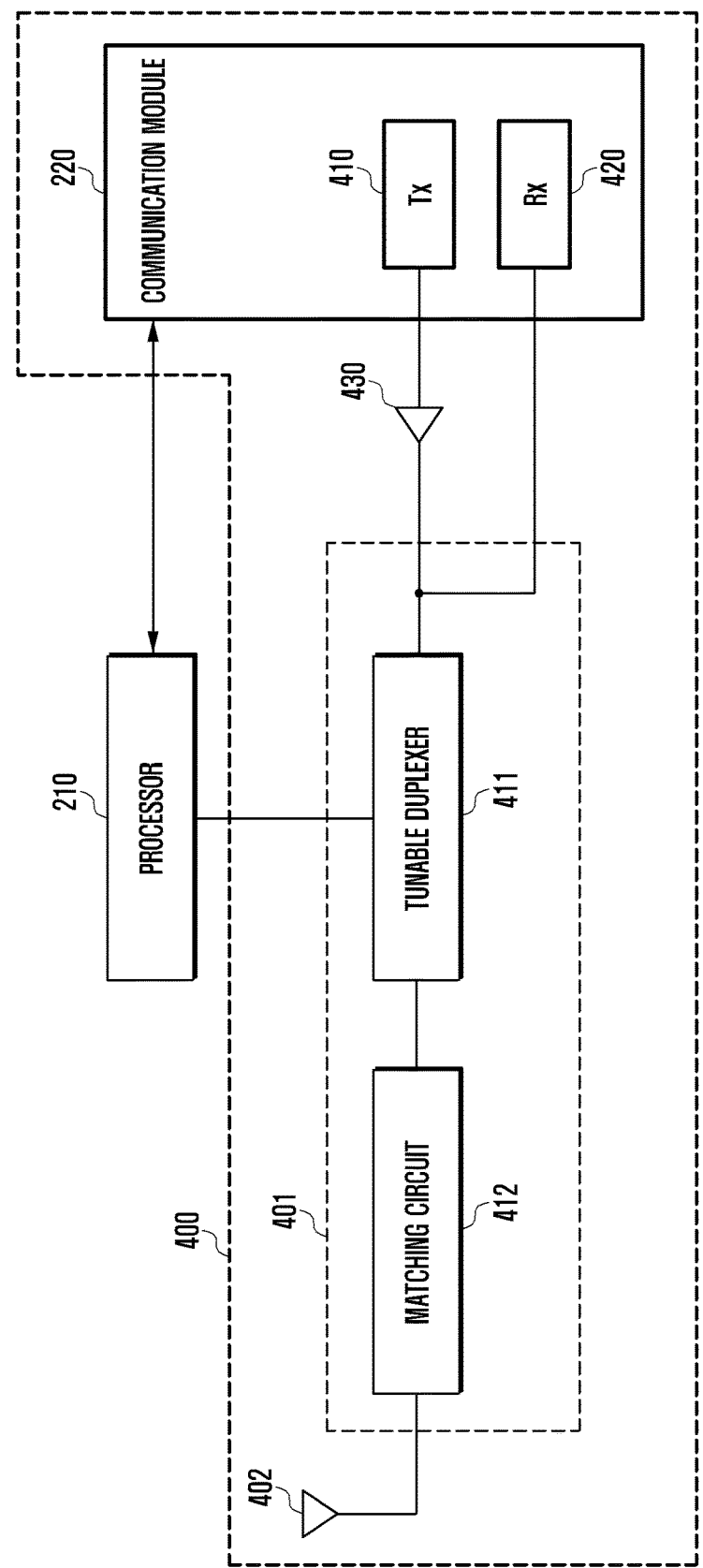
FIG. 5 is a block diagram of an electronic device that includes a communication device according to an embodiment of the present disclosure.

FIG. 5 is a block diagram of an electronic device 200 that includes a communication device 400 according to one embodiment of the present disclosure.

The electronic device 200 may include a processor 210 and the communication device 400. The communication device 400 may include a multiplexer unit 401, an antenna unit 402, a communication module 220, and a buffer 430, and the communication module 220 may include a transmitting end (TX) 410 and a receiving end (RX) 420. The multiplexer unit 401 may include a tunable duplexer 411 and a matching circuit 412. The buffer 430 may forward, to the multiplexer unit 401, a signal that is transferred from the transmitting end 410.

The communication module 220 may control a signal transmitted by the transmitting end (TX) 410 and a signal received by the receiving end (RX) 420 under the control of the processor 210. The processor 210 may identify and control a signal that moves in the communication module 220.

The multiplexer unit 401 may forward a signal received through the antenna unit 402 to the electronic device 200, which is connected to the communication device 400, through the receiving end 420, and may forward a signal, which is transferred through the transmitting end 410 and the buffer 430 from the electronic device 200, through the antenna unit 402.

The tunable duplexer 411, which is included in the multiplexer unit 401, may change the resonant frequency thereof according to a control signal transferred from the processor 210. The communication device 400 may transmit/receive various bands of frequencies by changing the resonant frequency of the tunable duplexer 411 according to the control signal transferred from the processor 210.

In various embodiments, the tunable duplexer 411, which is included in the multiplexer unit 401, may change the resonant frequency thereof according to a control signal transferred from the processor 210. The communication device 400 may transmit/receive various bands of frequencies by changing the frequency pass band of a BPF included in the tunable duplexer 411, or the impedance of the tunable duplexer 411, which corresponds to the resonant frequency, according to the control signal transferred from the processor 210.

In various embodiments, the tunable duplexer 411, which is included in the multiplexer unit 401, may change an antenna resonant frequency according to a control signal transferred from the processor 210. The communication device 400 may transmit/receive various bands of frequencies by changing the frequency pass band of a BPF included in the tunable duplexer 411, or the impedance of the tunable duplexer 411, which corresponds to the antenna resonant frequency, according to the control signal transferred from the processor 210.

The matching circuit 412 may be located between the antenna unit 402 and the tunable duplexer 411 to match an RF signal level or the impedance between the antenna unit 402 and the tunable duplexer 411. The impedance of the matching circuit 412 may be changed by the processor 210 in order to match the antenna unit 402 and the tunable duplexer 411. In various embodiments, the matching circuit 412, when being designed, may have the impedance for matching the antenna unit 402 and the tunable duplexer 411.

Figure 6:
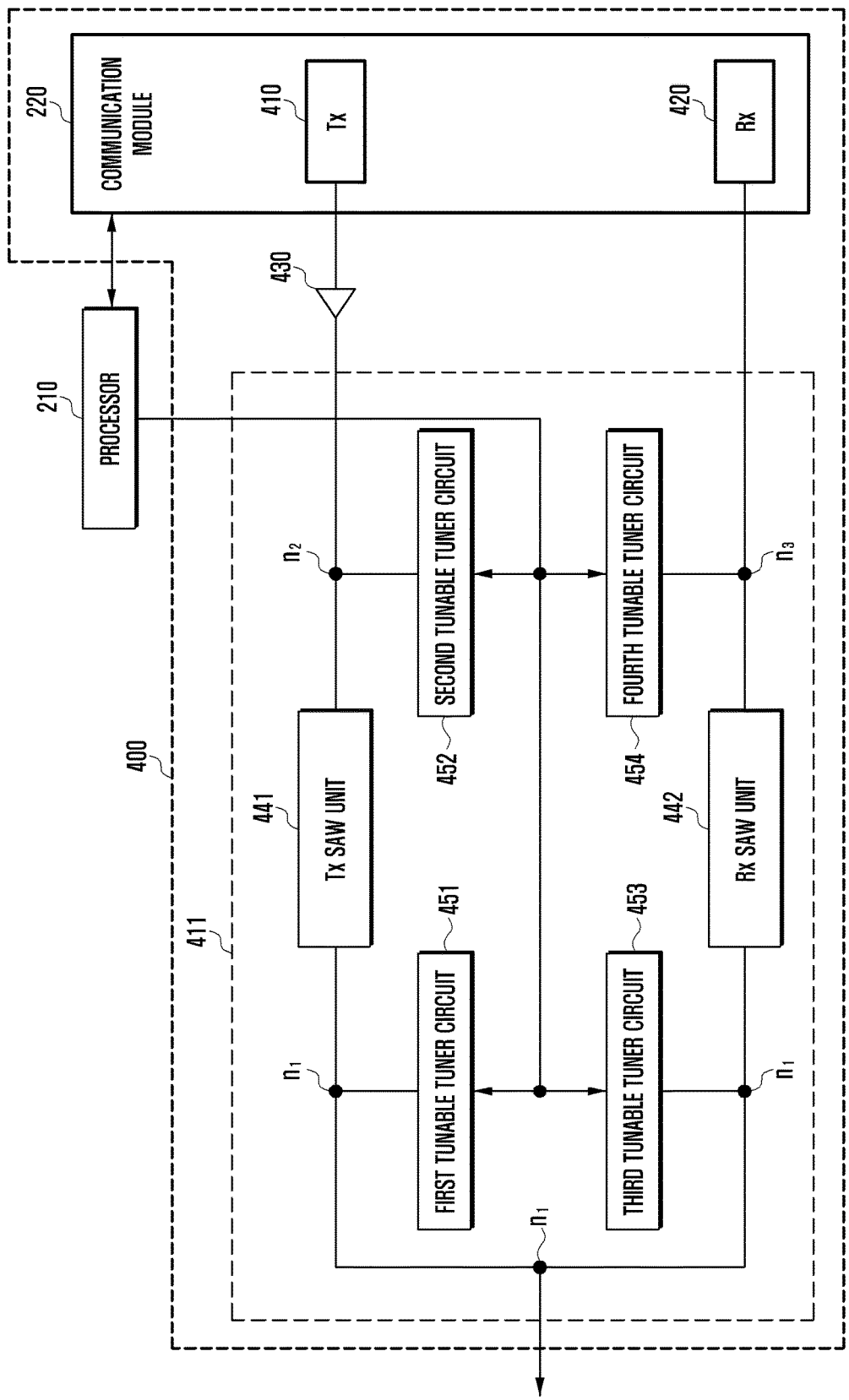
FIG. 6 is a block diagram of an electronic device that includes a tunable duplexer according to an embodiment of the present disclosure.

FIG. 6 is a block diagram of an electronic device 200 that includes a tunable duplexer 411 according to one embodiment of the present disclosure. The tunable duplexer 411, according to one embodiment, may change a transmittable/receivable resonant frequency using a passive element.

The tunable duplexer 411 may include a TX SAW unit 441, an RX SAW unit 442, a first tunable tuner circuit 451, a second tunable tuner circuit 452, a third tunable tuner circuit 453, and a fourth tunable tuner circuit 454.

The TX SAW unit 441 may filter a signal transmitted from a transmitting end 410 to a transmittable frequency band and may transfer the same to an antenna unit 402. The RX SAW unit 442 may filter a signal transmitted from the antenna unit 402 to a receivable frequency band and may transfer the same to a receiving end 420.

The first tunable tuner circuit 451 may be connected to a first node n1 that is connected with the antenna unit 402 or a matching circuit 412 (not shown). The first node n1 may be connected with the first tunable tuner circuit 451, the third tunable tuner circuit 453, the TX SAW unit 441, and the RX SAW unit 442.

The second tunable tuner circuit 452 may be connected to a second node n2 that is connected with the transmitting end 410 or a buffer 430. The second node n2 may be connected with the second tunable tuner circuit 452, the TX SAW unit 441, the transmitting end 410, or the buffer 430.

The third tunable tuner circuit 453 may be connected to the first node n1 that is connected with the antenna unit 402 or the matching circuit 412.

The fourth tunable tuner circuit 454 may be connected to a third node n3 that is connected with the receiving end 420. The third node n3 may be connected with the RX SAW unit 442 and the transmitting end 410.

The first tunable tuner circuit 451, the second tunable tuner circuit 452, the third tunable tuner circuit 453, and the fourth tunable tuner circuit 454 may change the impedance according to a control signal transferred from a processor 210.

When a frequency capable of carrying communication or a transmittable/receivable frequency is discovered through the communication module 220, the processor 210 may output a control signal for changing the impedance of one or more passive elements that are included in the tunable duplexer 411 such that the tunable duplexer 411 may have a resonant frequency that corresponds to the frequency capable of carrying communication or the transmittable/receivable frequency.

The first tunable tuner circuit 451, the second tunable tuner circuit 452, the third tunable tuner circuit 453, and the fourth tunable tuner circuit 454 may be connected to the TX SAW unit 441 or the RX SAW unit 442 to change a frequency that the TX SAW unit 441 or the RS SAW unit 442 can filter.

The first tunable tuner circuit 451 and the second tunable tuner circuit 452 may be connected to opposite ends of the TX SAW unit 441 to change the frequency in a band that the TX SAW unit 441 can filter. The first tunable tuner circuit 451 and the second tunable tuner circuit 452 may change the impedance thereof according to a control signal transferred from the processor 210 in order to change the frequency in the band that the TX SAW unit 441 can filter.

The third tunable tuner circuit 453 and the fourth tunable tuner circuit 454 may be connected to opposite ends of the RX SAW unit 442 to change the frequency in a band that the RX SAW unit 442 can filter. The third tunable tuner circuit 453 and the fourth tunable tuner circuit 454 may change the impedance thereof according to a control signal transferred from the processor 210 in order to change the frequency in the band that the RX SAW unit 442 can filter.

Figure 7:
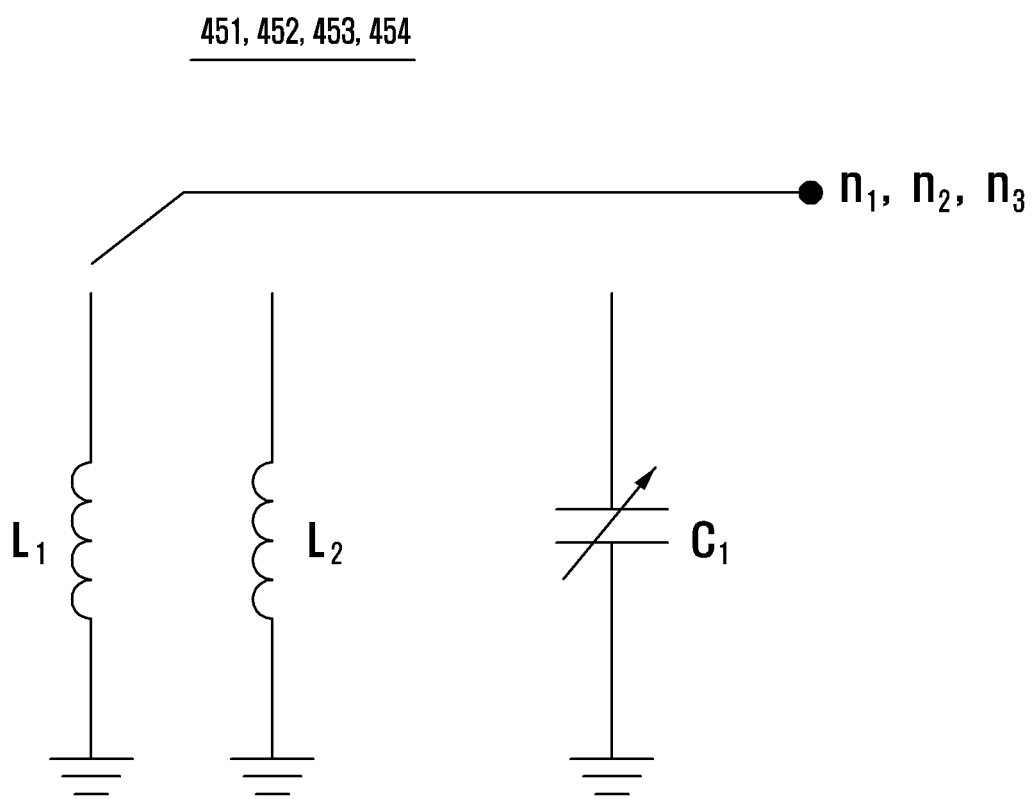
FIG. 7 is a schematic diagram of first to fourth tunable tuner circuits according to an embodiment of the present disclosure.

FIG. 7 is a schematic diagram of the first to fourth tunable tuner circuits 451 to 454, according to one embodiment of the present disclosure.

Each of the first to fourth tunable tuner circuits 451 to 454 may include variable inductors L1 and L2, of which the inductance may be changed according to a control signal, and a variable capacitor C1, of which the capacitance may be changed according to a control signal. Each of the variable inductors L1 and L2 may be grounded at one end thereof and may be connected, at the other end thereof, to the first node n1, the second node n2, or the third node n3. The variable capacitor C1 may be grounded at one end thereof and may be connected, at the other end thereof, to the first node n1, the second node n2, or the third node n3.

Figure 8:
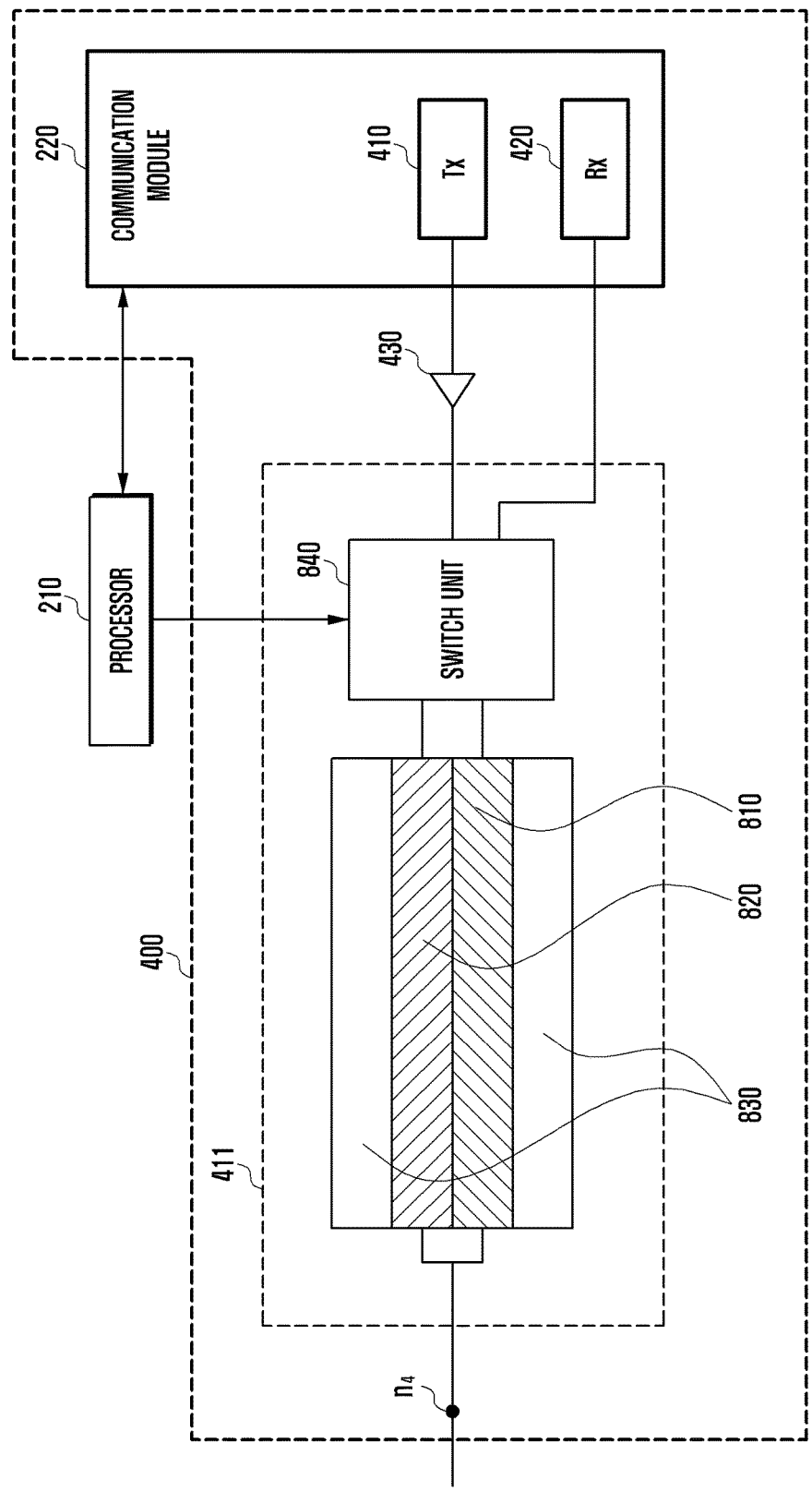
FIG. 8 is a block diagram of an electronic device that includes a tunable duplexer according to an embodiment of the present disclosure.

FIG. 8 is a block diagram of an electronic device 200 that includes a tunable duplexer 411 according to one embodiment of the present disclosure.

The tunable duplexer 411, according to one embodiment of the present disclosure, may select the frequencies that two or more SAW filters can filter, by selecting amongst two or more SAW filters, disposed adjacent to each other, that are capable of filtering at different frequencies. In FIG. 8, in a case where the two or more SAW filters are disposed adjacent to each other, substrates may be configured to be disposed on the top and the bottom of the SAW filters, and the two or more SAW filters may be configured to be adjacent to each other.

When a frequency capable of carrying communication or a transmittable/receivable frequency is discovered through a communication module 220, a processor 210 may output a control signal for selecting one of the plurality of SAW filters (e.g., the first SAW filter 810 or the second SAW filter 820), which are included in the tunable duplexer 411, such that the tunable duplexer 411 may have a resonant frequency that corresponds to the frequency capable of carrying communication or the transmittable/receivable frequency.

The tunable duplexer 411 may include the first SAW filter 810, the second SAW filter 820, the substrates 830, and a switch unit 840. A SAW filter vibrates at the resonant frequency thereof while a piezoelectric material oscillates, in which the gap of an inter-digital transducer (IDT) included in the SAW filter affects the resonant frequency. The gap of an inter-digital transducer (IDT) included in the first SAW filter 810 may differ from that of an IDT included in the second SAW filter 820. The tunable duplexer 411 may be connected to an antenna unit 402 or a matching circuit 412 (not shown) through the fourth node n4.

When the processor 210 transfers a control signal to the switch unit 840, the switch unit 840 may select the first or second SAW filter 810 or 820 according to the control signal. The communication device 400 may filter a frequency band through the selected first or second SAW filter 810 or 820.

The substrates 830 may be piezoelectric materials that have the same configuration as the plurality of SAW filters (e.g., the first and second SAW filters 810 and 820).

Figure 9:
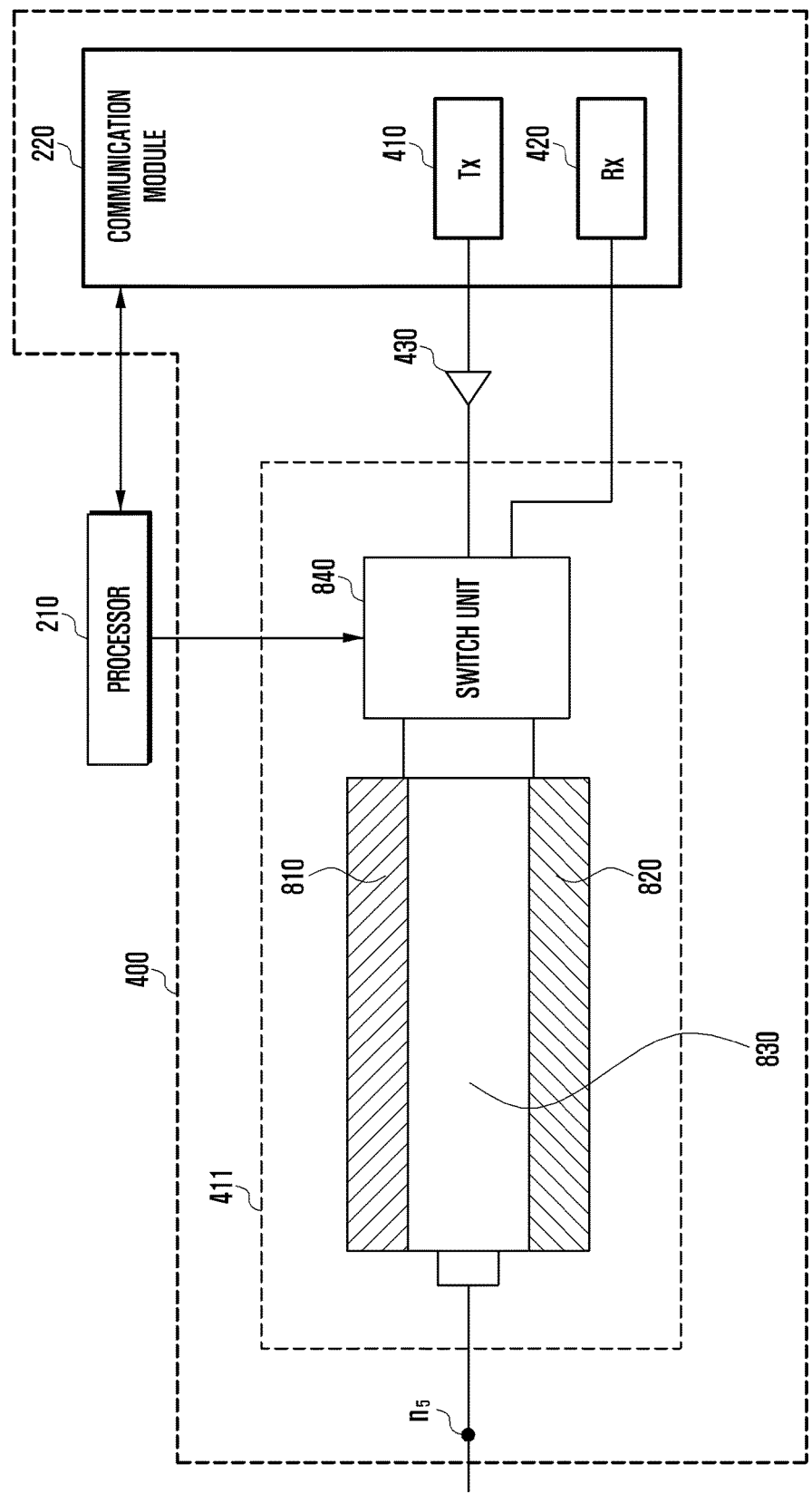
FIG. 9 is a block diagram of an electronic device that includes a tunable duplexer according to an embodiments of the present disclosure.

FIG. 9 is a block diagram of an electronic device 200 that includes a tunable duplexer 411 according to one embodiment of the present disclosure.

The tunable duplexer 411, according to one embodiment of the present disclosure, may select the frequencies that two or more SAW filters can filter, by selecting amongst two or more SAW filters, where the substrate of the first SAW filter and a substrate of the second SAW filter are disposed to be adjacent to each other, the first SAW filter is disposed in a top layer above the substrates, and the second SAW filter is disposed in a bottom layer below the substrates.

In FIG. 9, in a case where one SAW filter is in the top layer and another SAW filter is in the bottom layer, substrates may be configured to be adjacent to each other.

When a frequency capable of carrying communication or a transmittable/receivable frequency is discovered through a communication module 220, a processor 210 may output a control signal for selecting one of the plurality of SAW filters (e.g., the first SAW filter 810 and the second SAW filter 820), which are included in the tunable duplexer 411, such that the tunable duplexer 411 may have a resonant frequency that corresponds to the frequency capable of carrying communication or the transmittable/receivable frequency.

The tunable duplexer 411 may include the first SAW filter 810, the second SAW filter 820, the substrates 830, and a switch unit 840. A SAW filter vibrates at the resonant frequency thereof while a piezoelectric material oscillates, in which the gap of an inter-digital transducer (IDT) included in the SAW filter affects the resonant frequency. The gap of an inter-digital transducer (IDT) included in the first SAW filter 810 may differ from that of an IDT included in the second SAW filter 820. The tunable duplexer 411 may be connected to an antenna unit 402 or a matching circuit 412 through the fifth node n5.

When the processor 210 transfers a control signal to the switch unit 840, the switch unit 840 may select the first or second SAW filter 810 or 820 according to the control signal. The communication device 400 may filter a frequency band through the selected first or second SAW filter 810 or 820.

The substrates 830, which contains substrates for both SAW filters 810 and 820, may be piezoelectric materials that have the same configuration as the plurality of SAW filters (e.g., the first and second SAW filters 810 and 820).

Figure 10:
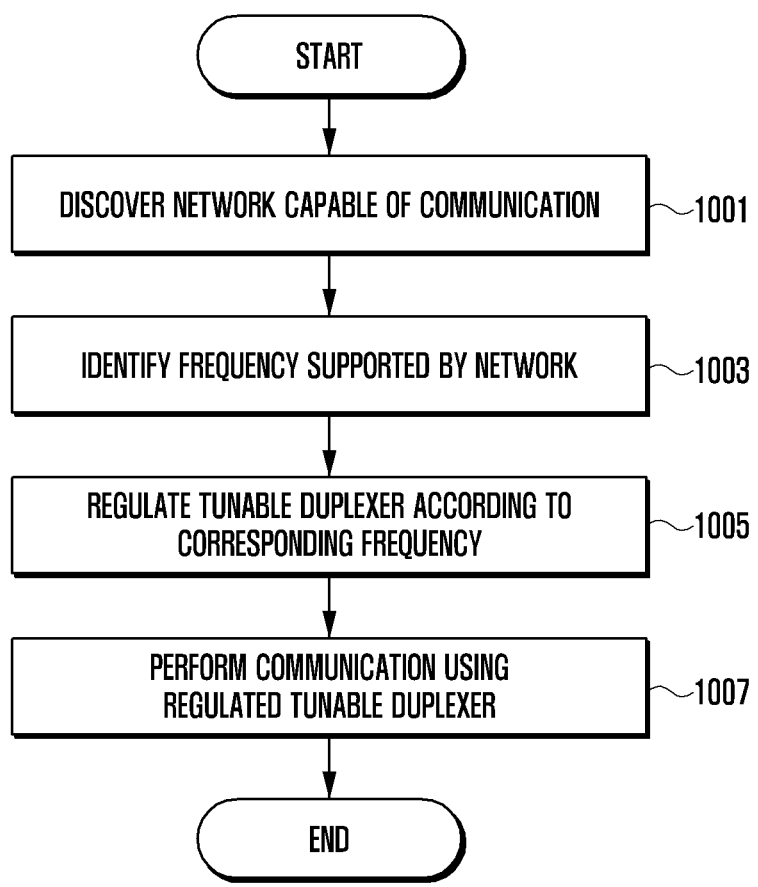
FIG. 10 is a flowchart illustrating a communication method of an electronic device that includes a communication device, according to an embodiment of the present disclosure.

FIG. 10 is a flowchart illustrating a communication method of the electronic device 200 that includes the communication device 400, according to one embodiment of the present disclosure.

In operation 1001, the electronic device 200 may discover a network capable of communication through the communication module 220. In operation 1003, the electronic device 200 may identify the frequency supported by the network. In operation 1005, the electronic device 200 may regulate the tunable duplexer 411 of the communication device 400 according to the identified frequency. In operation 1007, the electronic device 200 may perform communication using the regulated tunable duplexer 411.

Figure 11A:
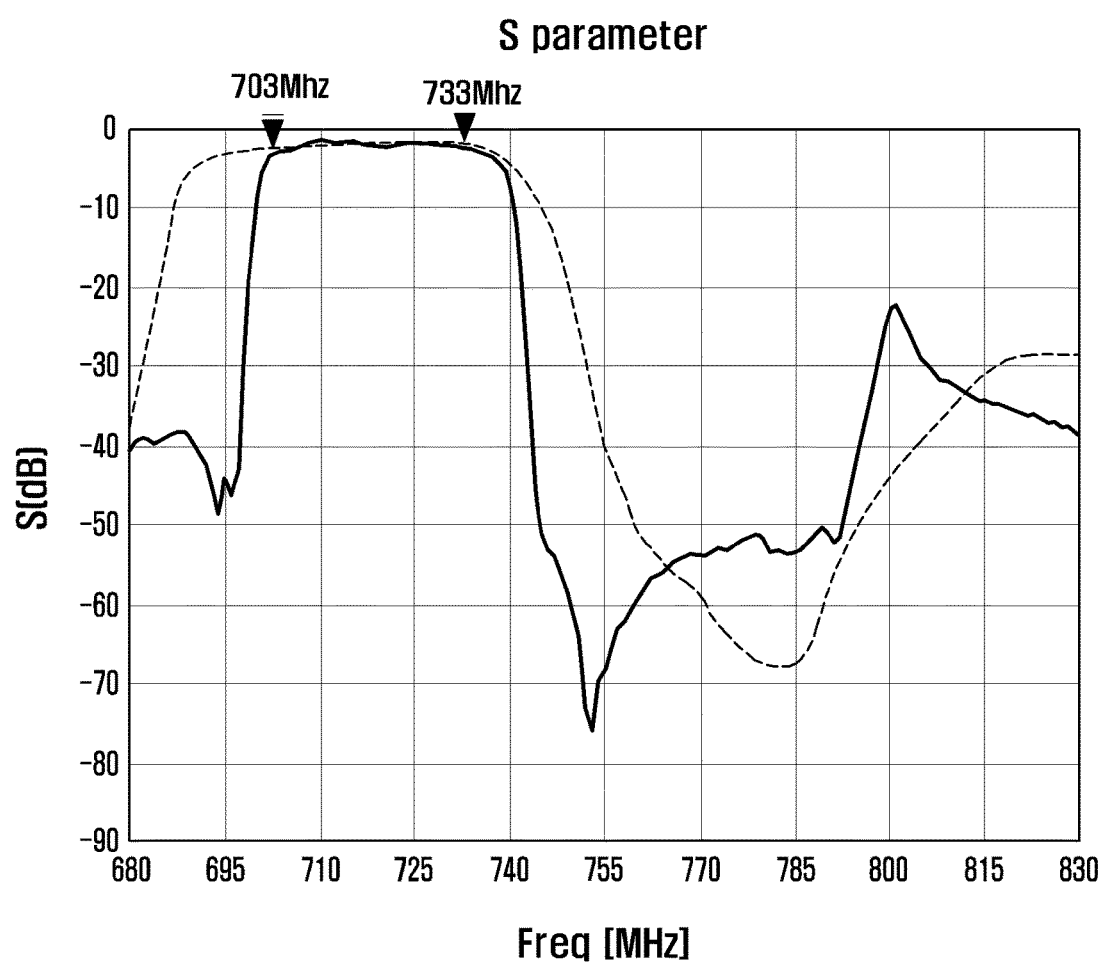
FIG. 11A and FIG. 11B are graphs depicting transmittable frequency bandwidths of an electronic device according to an embodiment of the present disclosure.
Figure 11B:
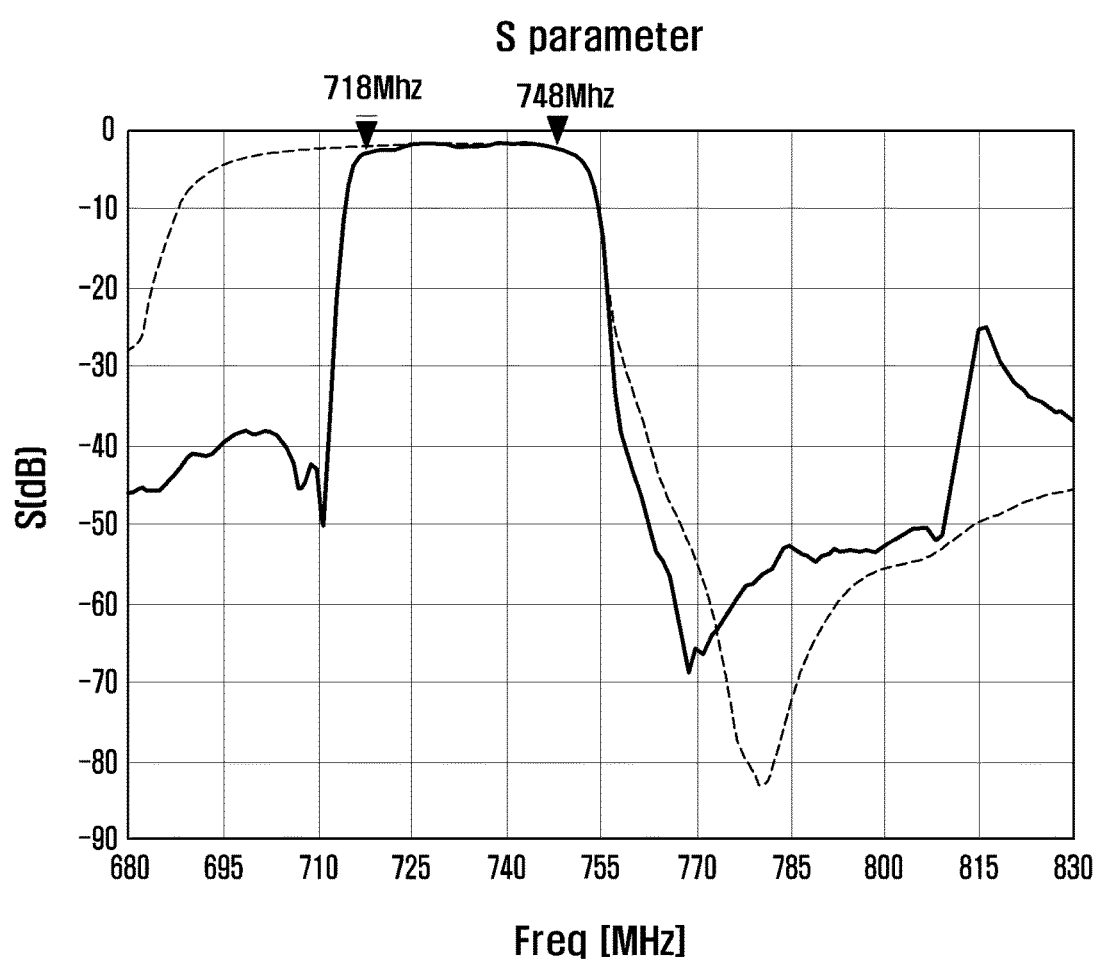

FIGS. 11A and 11B are graphs depicting transmittable frequency bandwidths of the electronic device 200, according to one embodiment of the present disclosure.

FIG. 11A is a graph depicting a transmittable frequency band of the transmitting end (TX) 410 of the electronic device 200 in a low-frequency region of a transmittable frequency band supported by a network. It will be exemplified that the frequency band supported by the network is band 28, which is the long term evolution (LTE) support frequency band.

In graph 1101, comparing the frequency range of 703 MHz to 733 MHz (solid line), which is a low-frequency region of the transmittable frequency band of band 28, with the transmittable frequency band (dotted line) of the transmitting end (TX) 410, it may be identified that the transmittable frequency band (dotted line) of the transmitting end (TX) 410 covers the band of 703 MHz to 733 MHz (solid line), which is a low-frequency region of the transmittable frequency band of band 28.

FIG. 11B is a graph depicting a transmittable frequency band of the transmitting end (TX) 410 of the electronic device 200 in a high-frequency region of the transmittable frequency band supported by the network. It will be exemplified that the frequency band supported by the network is band 28, which is the long term evolution (LTE) support frequency band.

In graph 1103, comparing the frequency range of 718 MHz to 748 MHz (solid line), which is a high-frequency region of the transmittable frequency band of band 28, with the transmittable frequency band (dotted line) of the transmitting end (TX) 410, it may be identified that the transmittable frequency band (dotted line) of the transmitting end (TX) 410 covers the band of 718 MHz to 748 MHz (solid line), which is a high-frequency region of the transmittable frequency band of band 28.

Figure 12A:
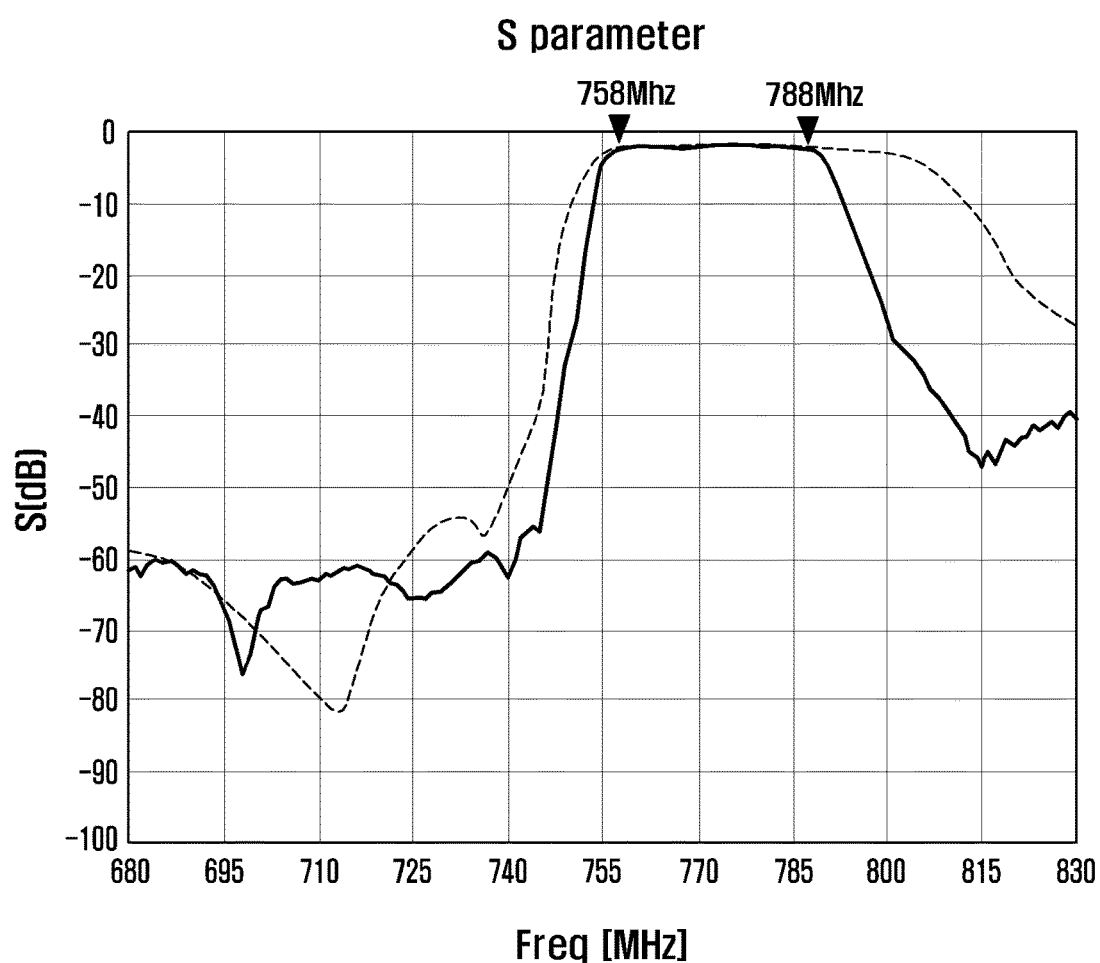
FIG. 12A and FIG. 12B are graphs depicting receivable frequency bandwidths of an electronic device according to an embodiment of the present disclosure.
Figure 12B:
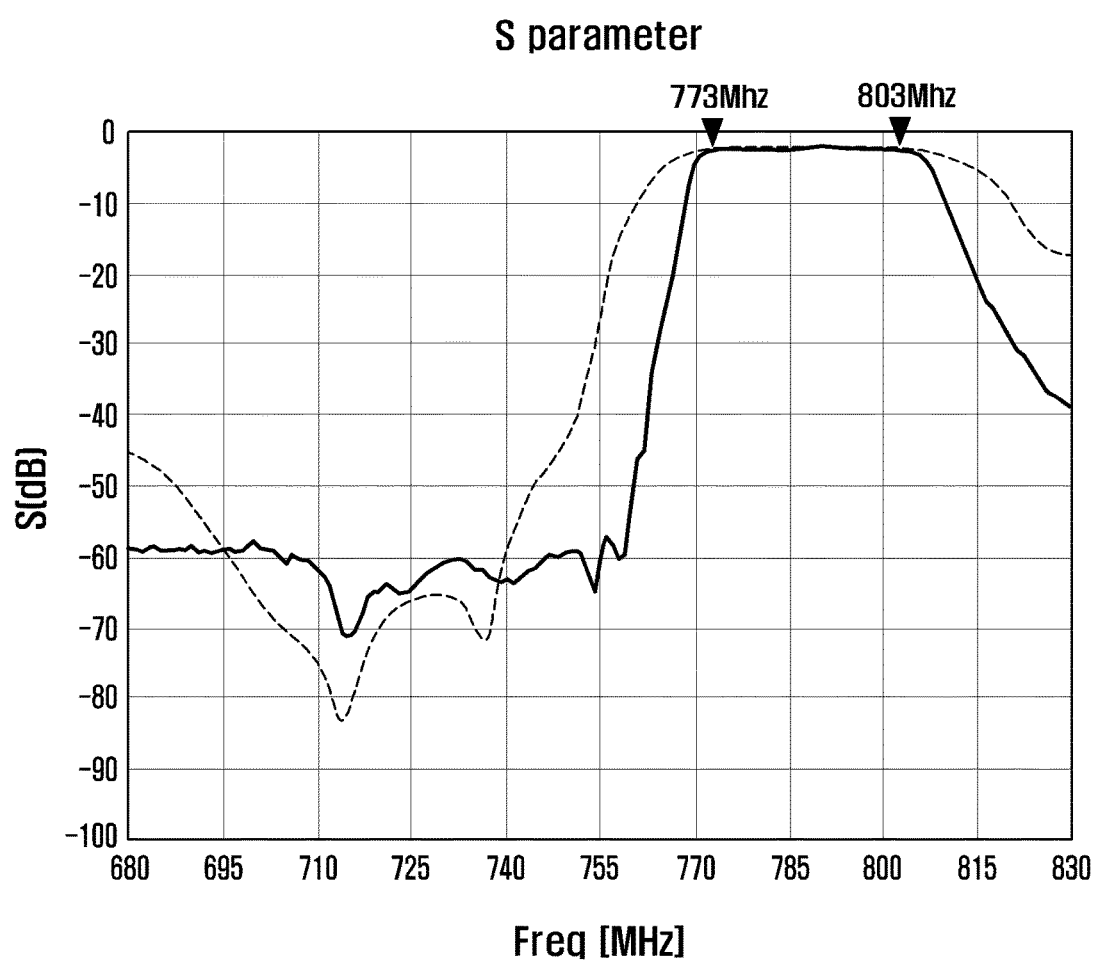

FIGS. 12A and 12B are graphs depicting receivable frequency bandwidths of the electronic device 200, according to one embodiment of the present disclosure.

FIG. 12A is a graph depicting a receivable frequency band of the receiving end (RX) 420 of the electronic device 200 in a low-frequency region of the receivable frequency band supported by the network. It will be exemplified that the frequency band supported by the network is band 28, which is the long term evolution (LTE) support frequency band.

In graph 1201, comparing the frequency range of 758 MHz to 788 MHz (solid line), which is a low-frequency region of the receivable frequency band of band 28, with the receivable frequency band (dotted line) of the receiving end (RX) 420, it may be identified that the receivable frequency band (dotted line) of the receiving end (RX) 420 covers the band of 758 MHz to 788 MHz (solid line), which is a low-frequency region of the receivable frequency band of band 28.

FIG. 12B is a graph depicting a receivable frequency band of the receiving end (RX) 420 of the electronic device 200 in a high-frequency region of the receivable frequency band supported by the network. It will be exemplified that the frequency band supported by the network is band 28, which is the long term evolution (LTE) support frequency band.

In graph 1203, comparing the frequency range of 773 MHz to 803 MHz (solid line), which is a high-frequency region of the receivable frequency band of band 28, with the receivable frequency band (dotted line) of the receiving end (RX) 420, it may be identified that the receivable frequency band (dotted line) of the receiving end (RX) 420 covers the band of 773 MHz to 803 MHz (solid line), which is a high-frequency region of the receivable frequency band of band 28.

Referring to FIGS. 11A, 11B, 12A, and 12B, the electronic device 200 of the present disclosure, which uses a tunable duplexer, can efficiently support transmission/reception frequency bands while using a small system area in a case where the bandwidths of transmission and reception frequencies are wide, whereas the separation distance between the transmission and reception frequency bands is narrow, as well as in a general transmission/reception environment.

For example, in a case where the frequency band supported by a network is band 28, which is the long term evolution (LTE) support frequency band, the transmittable frequency band ranges from 703 MHz to 748 MHz (45 MHz), and the receivable frequency band ranges from 758 MHz to 803 MHz (45 MHz). However, the separable frequencies of the transmittable and receivable frequencies are 748 MHz and 758 MHz, in which the difference therebetween merely corresponds to 10 MHz. In this case, the electronic device 200 of the present disclosure can efficiently support transmission/reception frequency bands while using a small system area.

It should be understood by those skilled in the art that the above described embodiments are only embodiments and are not restrictive since the embodiments can be implemented in other concrete forms without any change in the technical idea or essential characteristics of the present disclosure. The scope of the present disclosure is defined by the appended claims to be described later, rather than the detailed description. Accordingly, it will be appreciated that all modifications or variations derived from the meaning and scope of the appended claims and their equivalents are included in the range of the present disclosure.

The above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. Any of the functions and steps provided in the Figures may be implemented in hardware, or a combination hardware configured with machine executable code and may be performed in whole or in part within the programmed instructions of a computer. No claim element herein is to be construed under the provisions of pre-AIA 35 U.S.C. 112, sixth paragraph, or 35 U.S.C. 112(f), unless the element is expressly recited using the phrase "means for."

What is claimed is:

1. A communication device comprising:
   a communication module configured to discover a network capable of communication;
   a processor configured to identify a first frequency band of the network and to output a control signal for changing a pass band of a band pass filter;
   a multiplexer configured to change the pass band of the band pass filter to correspond to the first frequency band of the network;
   a tunable tuner circuit configured to change an impedance thereof according to the control signal; and
   an antenna that comprises one or more antennas,
   wherein the tunable tuner circuit comprises a variable inductor having an inductance that is changed according to the control signal and a variable capacitor having a capacitance that is changed according to the control signal,
   wherein the multiplexer comprises a surface acoustic wave (SAW) filter configured to filter a signal to or from the network corresponding to the frequency band of the network, and
   wherein the tunable tuner circuit is located between the SAW filter and the antenna, between the SAW filter and a receiving end, and between the SAW filter and a transmitting end.

2. The communication device of claim 1, wherein the multiplexer selectively separates signals transferred through the antenna according to a second frequency band capable of carrying communication to the receiving end.

3. The communication device of claim 1, wherein the multiplexer forwards signals transferred from the transmitting end to the antenna.

4. The communication device of claim 1, wherein the multiplexer comprises a tunable duplexer configured to change the pass band of the band pass filter to correspond to a resonant frequency of the network according to the control signal.

5. The communication device of claim 1, wherein the processor is further configured to:
   discover the network capable of communication, and
   change the pass band of the band pass filter to correspond to the first frequency band of the network by changing the impedance of the tunable tuner circuit according to the control signal.

6. The communication device of claim 5, wherein the processor is further configured to:
   filter a signal to or from the network corresponding to the frequency band of the network.

7. The communication device of claim 5, wherein the processor is further configured to:
   selectively separate signals transferred through the antenna according to a second frequency band capable of carrying communication to a receiving end,
   transfer the signals to the receiving end.

8. The communication device of claim 1, wherein the processor is further configured to:
   forward signals transferred from the transmitting end to the antenna.

9. The communication device of claim 1, wherein the processor is further configured to:
   change the pass band of the band pass filter to correspond to a resonant frequency of the network according to the control signal.

* * * * *